(12) United States Patent
Iihola et al.

(10) Patent No.: US 8,455,994 B2
(45) Date of Patent: Jun. 4, 2013

(54) ELECTRONIC MODULE WITH FEED THROUGH CONDUCTOR BETWEEN WIRING PATTERNS

(75) Inventors: Antti Iihola, Helsinki (FI); Risto Tuominen, Espoo (FI)

(73) Assignee: Imbera Electronics Oy, Espoo (FI)

( * ) Notice: Subject to any disclaimer, the term of this patent is extended or adjusted under 35 U.S.C. 154(b) by 337 days.

(21) Appl. No.: 12/842,056

(22) Filed: Jul. 23, 2010

(65) Prior Publication Data

US 2010/0308452 A1 Dec. 9, 2010

Related U.S. Application Data

(63) Continuation-in-part of application No. 11/878,557, filed on Jul. 25, 2007, now Pat. No. 7,989,944, which is a continuation of application No. 10/502,336, filed on Sep. 23, 2004, now Pat. No. 7,294,529.

(30) Foreign Application Priority Data

Jan. 31, 2002 (FI) ..................... 20020191

(51) Int. Cl.
*H01L 23/48* (2006.01)

(52) U.S. Cl.
USPC .... 257/692; 257/698; 257/690; 257/E23.005; 257/E23.011

(58) Field of Classification Search
USPC ................ 257/E23.005, E23.126, E23.128, 257/E23.182, E21.5, E21.503, E21.505, E21.511; 438/107, 118, 126
See application file for complete search history.

(56) References Cited

U.S. PATENT DOCUMENTS

| | | | |
|---|---|---|---|
| 4,246,595 | A | 1/1981 | Noyori et al. |
| 5,102,829 | A | 4/1992 | Cohn |
| 5,162,613 | A | 11/1992 | Schoenthaler |
| 5,208,188 | A | 5/1993 | Newman |
| 5,216,806 | A | 6/1993 | Lam |

(Continued)

FOREIGN PATENT DOCUMENTS

| | | |
|---|---|---|
| CN | 2710160 Y | 7/2005 |
| JP | 2002-016327 | 1/2002 |
| JP | 3537626 | 6/2004 |
| JP | 3696735 | 9/2005 |

*Primary Examiner* — Mamadou Diallo
(74) *Attorney, Agent, or Firm* — Seppo Laine Oy; Joshua P. Wert

(57) ABSTRACT

The electronic module comprises a dielectric 1031 substrate having a first surface and a second surface and an installation cavity extending through the dielectric substrate and having a perimetrical side wall. The electronic module further comprises a first wiring layer 1032 on the first surface, a second wiring layer 1033 on the second surface, and a feed through conductor 1034 on the perimetrical side wall and electrically connecting at least one conductor in the first wiring layer to at least one conductor in the second wiring layer. There is also at least one IC inside the installation cavity. The electronic module further comprises a first insulating layer 1035 on the second wiring layer, a second insulating layer 1036 on the first wiring layer, and a third wiring layer 1037 on the first insulating layer. First microvias 1038 inside the first insulating layer make electrical connections between the second wiring layer and the third wiring layer. Second microvias 1039 electrically connect the IC to at least one of the second wiring layer and the third wiring layer. The electronic module comprises also a fourth wiring layer 1040 on the second insulating layer and third microvias 1041 inside the second insulating layer and making electrical connections between the first wiring layer and the fourth wiring layer.

18 Claims, 29 Drawing Sheets

U.S. PATENT DOCUMENTS

| | | | |
|---|---|---|---|
| 5,227,338 A | 7/1993 | Kryzaniwsky | |
| 5,248,852 A | 9/1993 | Kumagai | |
| 5,306,670 A | 4/1994 | Mowatt et al. | |
| 5,497,033 A | 3/1996 | Fillion et al. | |
| 5,637,919 A | 6/1997 | Grabbe | |
| 5,943,216 A | 8/1999 | Schmidt | |
| 5,970,321 A | 10/1999 | Hively | |
| 6,015,722 A | 1/2000 | Banks et al. | |
| 6,038,133 A | 3/2000 | Nakatani et al. | |
| 6,100,108 A | 8/2000 | Mizuno et al. | |
| 6,131,269 A | 10/2000 | Lee et al. | |
| 6,154,366 A | 11/2000 | Ma et al. | |
| 6,271,469 B1 | 8/2001 | Ma et al. | |
| 6,284,564 B1 | 9/2001 | Balch et al. | |
| 6,292,366 B1 | 9/2001 | Platt | |
| 6,324,067 B1 | 11/2001 | Nishiyama | |
| 6,475,877 B1 | 11/2002 | Saia et al. | |
| 6,489,685 B2 | 12/2002 | Asahi et al. | |
| 6,495,394 B1 | 12/2002 | Nakata et al. | |
| 6,521,530 B2 * | 2/2003 | Peters et al. | 438/667 |
| 6,537,848 B2 | 3/2003 | Camenforte | |
| 6,538,210 B2 | 3/2003 | Sugaya et al. | |
| 6,607,943 B1 | 8/2003 | Kinsman | |
| 6,710,458 B2 | 3/2004 | Seko et al. | |
| 6,790,712 B2 | 9/2004 | Bai et al. | |
| 6,979,596 B2 | 12/2005 | Corlsis et al. | |
| 2001/0054758 A1 | 12/2001 | Isaak | |
| 2002/0020898 A1 | 2/2002 | Vu et al. | |
| 2002/0063342 A1 | 5/2002 | Blackshear | |
| 2002/0117743 A1 | 8/2002 | Nakatani et al. | |
| 2002/0127770 A1 | 9/2002 | Vaiyapuri | |
| 2002/0132096 A1 | 9/2002 | Takeuchi et al. | |
| 2002/0185303 A1 * | 12/2002 | Takeuchi et al. | 174/256 |
| 2003/0068852 A1 | 4/2003 | Towle et al. | |
| 2003/0090883 A1 | 5/2003 | Asahi et al. | |
| 2003/0100142 A1 | 5/2003 | Shin et al. | |
| 2003/0137045 A1 | 7/2003 | Sugaya et al. | |
| 2004/0266067 A1 | 12/2004 | Bai | |
| 2005/0285244 A1 | 12/2005 | Chen | |
| 2006/0105500 A1 | 5/2006 | Chang | |

\* cited by examiner

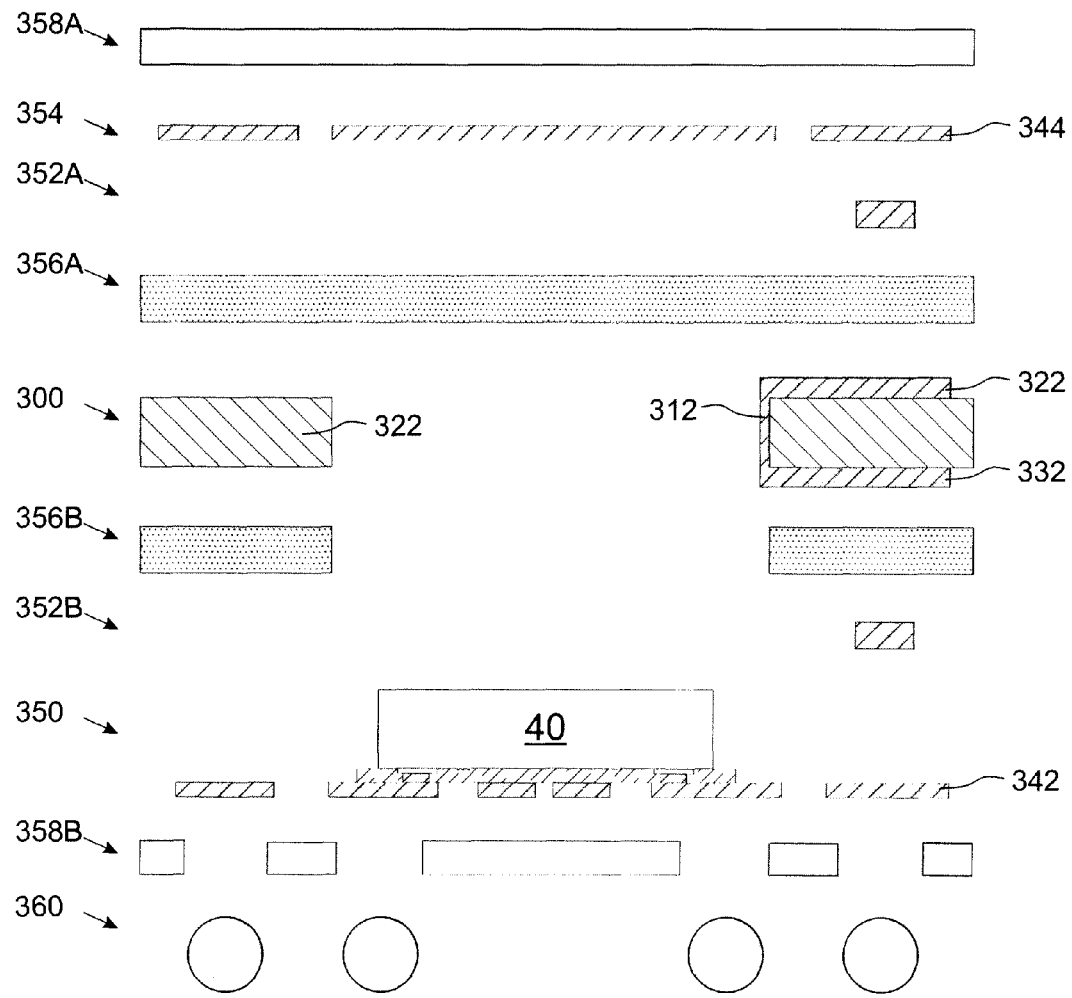
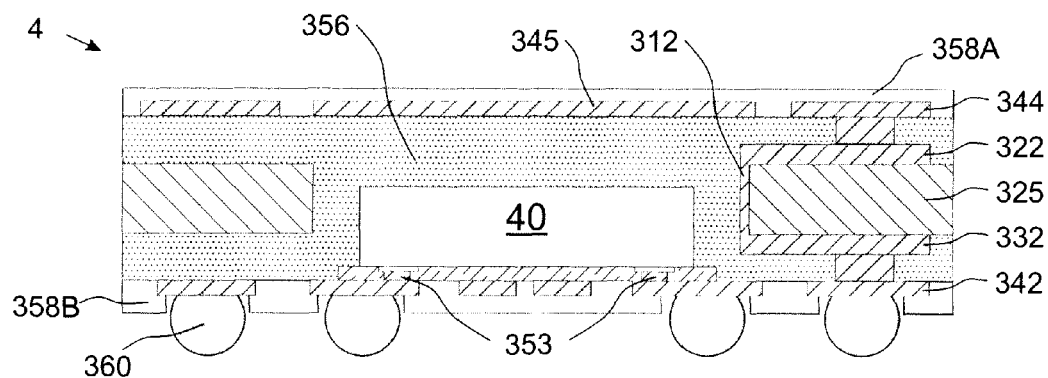
Fig. 7A
Fig. 7B

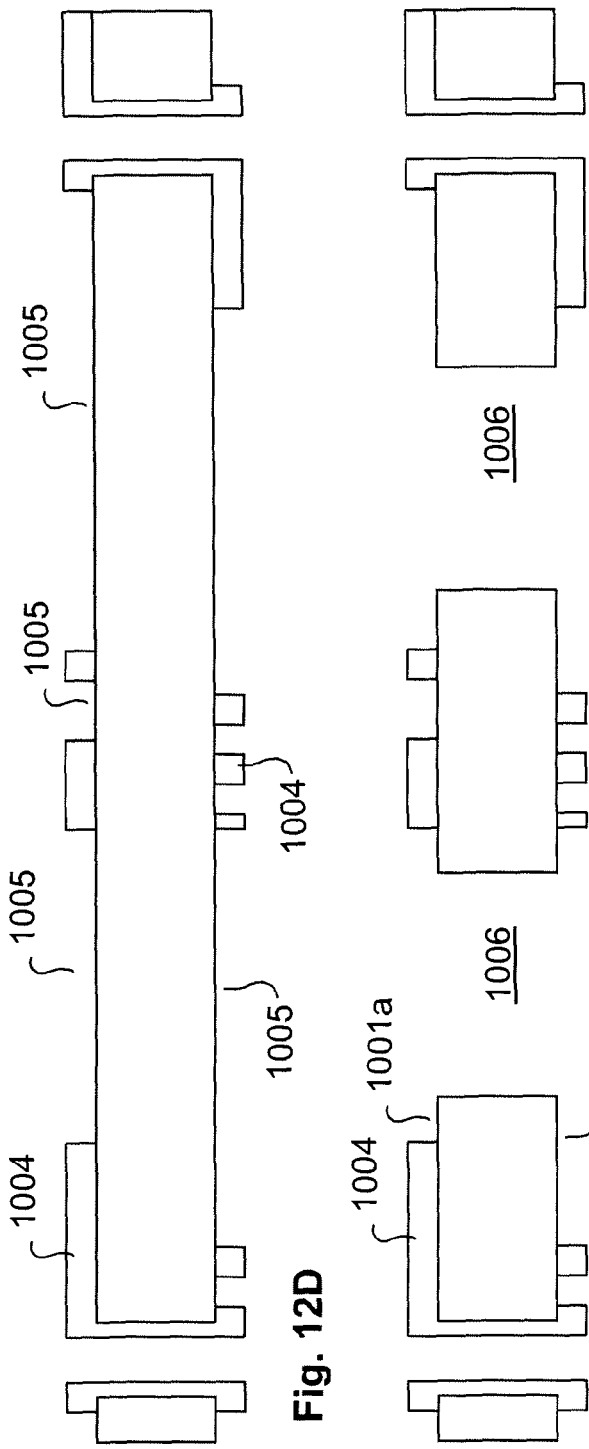
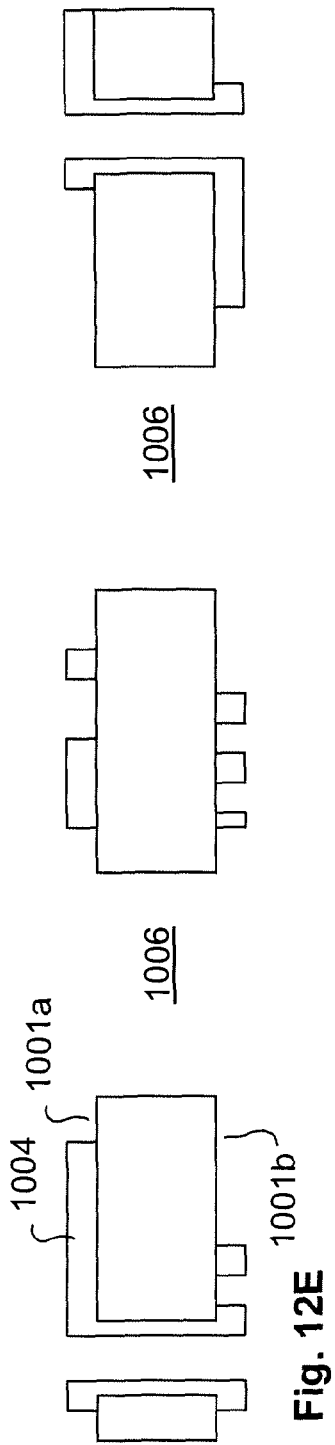
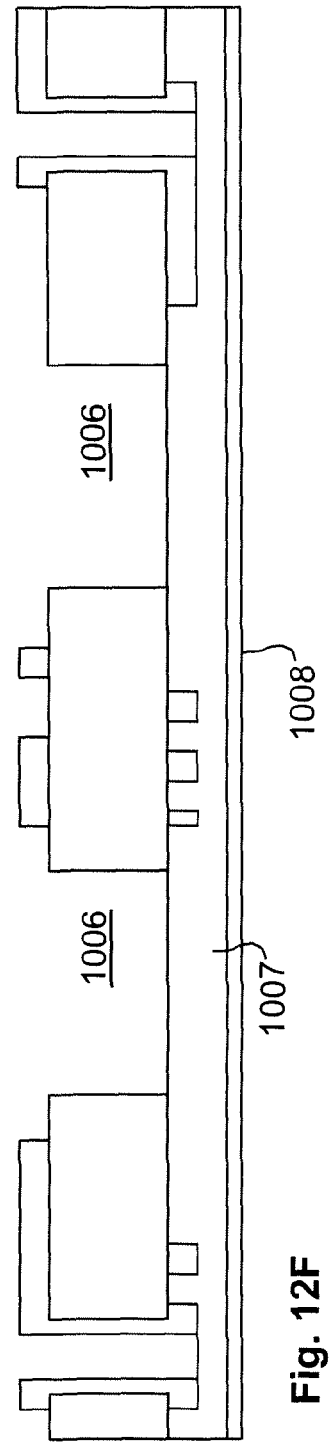
Fig. 12D
Fig. 12E
Fig. 12F

ELECTRONIC MODULE WITH FEED THROUGH CONDUCTOR BETWEEN WIRING PATTERNS

TECHNICAL FIELD

The present invention relates to electronic modules and structural parts thereof.

In particular, the present invention relates to electronic modules that comprise at least four wiring pattern layers and at least one semiconductor component at least partly embedded an insulating layer between the wiring pattern layers.

BACKGROUND ART

U.S. Patent Application Publication No. 2002/0135058 A1 (Asahi et al.) discloses a component build-in module with plated through hole solutions. With the aid of the presented embodiment an increase in routing density can be achieved as well as build-up layers need not to be constructed so many or at all. Nevertheless, when utilizing this method in microcircuits having for example hundreds of pads, it is inefficient and slow thus increasing manufacturing time and costs.

Presently, there are many different methods and available technologies to make an electrical connection between two sides of a wiring board with the aid of a penetrated hole, also called a through hole. One early phase method to make a through hole is to use a conductive rivet pin that is assembled into a through hole of an otherwise ready-made wiring board. The rivet pin solution is slow to assemble as well as expensive, unreliable and does not adequately reduce the size of necessary through holes. Other prior art methods are plated through holes (PTH) and via-on-via structures. All of the prior art methods fail to solve the problems presented above.

For example, by using chemical and/or electroplating technologies it is practically impossible to achieve reliable conductive micro vias having aspect ratio (height/width) greater than 1.00 when the diameter of micro vias are 150 μm or less. The same applies in case of through holes where a typical aspect ratio is 8:1 and in maximum 12:1. In other words, the throwing power limits the narrow and deep through holes or micro vias becoming reliably conductive and solid with the conductive material. Throwing power means ability to saturate narrow and deep through holes or micro vias with conductive material by means of chemical or electrolytic growing methods. The situation is also likewise by using any kind of conductive paste or adhesive in micro vias and through holes having a respective aspect ratio greater than mentioned above when the diameter of micro vias and through holes are 150 μm or less.

Thus, the background art contains different solutions that do not adequately provide high routing efficiency with an affordable price of the product. There remains a need to seek further techniques with potentially improved properties in view of routing efficiency and price, in particular when it is aimed to increase the number of contacts of the components and narrow the pitch between the contact lands, or bumps, on the component.

SUMMARY OF INVENTION

According to an aspect of the invention, there is provided an electronic module comprising: a dielectric substrate having a first surface and a second surface; an installation cavity extending through the dielectric substrate and having a perimetrical side wall between the first surface and the second surface; a first wiring layer on the first surface of the dielectric substrate; a second wiring layer on the second surface of the dielectric substrate; a feed through conductor on the perimetrical side wall of the installation cavity and electrically connecting at least one conductor in the first wiring layer to at least one conductor in the second wiring; at least one semiconductor component at least partially inside the installation cavity; a first insulating layer on the second wiring layer; a second insulating layer on the first wiring layer; a third wiring layer on the first insulating layer; first microvias inside the first insulating layer and making electrical connections between the second wiring layer and the third wiring layer; second microvias electrically connecting the at least one semiconductor component to at least one of the second wiring layer and the third wiring layer; a fourth wiring layer on the second insulating layer; and third microvias inside the second insulating layer and making electrical connections between the first wiring layer and the fourth wiring layer.

According to another aspect of the invention, there is provided a method for manufacturing an electronic module comprising: providing a dielectric substrate having a first surface and a second surface; making an installation cavity extending through the dielectric substrate and having a perimetrical side wall between the first surface and the second surface; making a first wiring layer on the first surface of the dielectric substrate; making a second wiring layer on the second surface of the dielectric substrate; making at least one feed through conductor on the perimetrical side wall of the installation cavity and electrically connecting at least one conductor in the first wiring layer to at least one conductor in the second wiring; providing at least one semiconductor component at least partially inside the installation cavity; making a first insulating layer on the second wiring layer; making a second insulating layer on the first wiring layer; making a third wiring layer on the first insulating layer; making first microvias inside the first insulating layer and making electrical connections between the second wiring layer and the third wiring layer; making second microvias electrically connecting the at least one semiconductor component to at least one of the second wiring layer and the third wiring layer; making a fourth wiring layer on the second insulating layer; and making third microvias inside the second insulating layer and making electrical connections between the first wiring layer and the fourth wiring layer.

According to a further aspect of the invention, the feed through conductor in the installation cavity is divided into portions such that a plurality of feed through conductors are formed on the perimetrical side wall of the installation cavity, the feed through conductors electrically connecting the first wiring layer and the second wiring to each other by a plurality of individual electrical routes.

Therefore, according to a further aspect of the invention, an electronic module comprises: a dielectric substrate having a first surface opposite a second surface; an installation cavity extending through the dielectric substrate and having a perimetrical side wall between the first surface and the second surface; a first wiring layer on the first surface of the dielectric substrate; a second wiring layer on the second surface of the dielectric substrate; at least two feed through conductors on the perimetrical side wall of the installation cavity and electrically connecting the first wiring layer and the second wiring to each other by at least two individual electrical routes; and at least one semiconductor component at least partially inside the installation cavity.

According to a further aspect of the invention, the electronic module comprises a dielectric substrate having a first surface opposite a second surface; an installation cavity extending through the dielectric substrate and having a perimetrical side wall between the first surface and the second surface; a first wiring layer on the first surface of the dielectric substrate; a second wiring layer on the second surface of the dielectric substrate; at least two feed through conductors on the perimetrical side wall of the installation cavity and electrically connecting the first wiring layer and the second wiring to each other by at least two individual electrical routes; and at least one semiconductor component at least partially inside the installation cavity.

According to an even further aspect of the invention, there is provided a semiconductor chip package comprising: a dielectric substrate having a first surface opposite a second surface; an installation cavity extending through the dielectric substrate between the first surface and the second surface, and having a side wall defining said cavity; at least one semiconductor chip having contact pads inside the installation cavity; a first wiring layer on the first surface of the dielectric substrate; a second wiring layer on the second surface of the dielectric substrate; feed through conductors on the side wall of the installation cavity and electrically connecting the first wiring layer and the second wiring; a first insulating layer on the second wiring layer; a third wiring layer on the first insulating layer; first microvias inside the first insulating layer and making electrical connections between the second wiring layer and the third wiring layer; and second microvias electrically connecting at least some of the contact pads of the semiconductor chip to the third wiring layer.

According to a further aspect of the invention, there is provided a method for manufacturing an electronic module or a semiconductor chip package comprising: providing a dielectric substrate having a first surface opposite a second surface; making an installation cavity extending through the dielectric substrate and having a perimetrical side wall between the first surface and the second surface; making a first wiring layer on the first surface of the dielectric substrate; making a second wiring layer on the second surface of the dielectric substrate; making at least two feed through conductors on the perimetrical side wall of the installation cavity and electrically connecting the first wiring layer and the second wiring to each other by means of the feed through conductors; and providing at least one semiconductor component at least partially inside the installation cavity.

According to a further aspect of the invention, there is provided a method for manufacturing an electronic module or a semiconductor chip package comprising: providing a dielectric substrate having a first surface opposite a second surface; making at least two feed through holes extending from the first surface to the second surface in the dielectric substrate; making a first wiring layer on the first surface of the dielectric substrate; making a second wiring layer on the second surface of the dielectric substrate; making at least two feed through conductors in the feed through holes, the feed through conductors electrically connecting the first wiring layer and the second wiring to each other; making an installation cavity through the dielectric substrate by cutting a portion of the dielectric substrate and a portion of the feed through holes and feed through conductors, and wherein the installation cavity has a perimetrical side wall between the first surface and the second surface, the remaining portion of the cut feed through holes forms a portion of the perimetrical side wall and the remaining portion of the cut feed through conductors are located on the perimetrical side wall; and providing at least one semiconductor component at least partially inside the installation cavity.

Considerable advantages are gained with the aid of the invention. This is because, with the aid of the invention, a circuit board can be manufactured with the semiconductor components embedded inside it. The invention also makes it possible to manufacture a small and reliable component package around a component.

The invention also permits a large number of embodiments, which provide significant additional advantages.

For example, with the aid of preferred embodiments of the invention, the component's packaging stage, the circuit board's manufacturing stage, and the assembly and contact-making stage of the semiconductor components can be combined to form a single totality. The combination of the various process stages brings important logistic benefits and permits the manufacture of a smaller and more reliable electronic module. There is the further advantage that such a manufacturing method can largely exploit circuit board manufacturing and assembly technologies that are in general use.

According to a preferred embodiment of the invention, the totality of the composite process is simpler than, for example, using flip-chip technology to manufacture a circuit board and attach the components to the circuit board. By means of such preferred embodiments, the following advantages over the conventional solution are obtained:

Soldering is not required to form contacts with the components, instead an electrical contact can be manufactured by growing conductors on top of the contact areas of a semiconductor component. This means that there is no need to use molten metal to connect the components, so that compounds are not formed between metals. Compounds between metals are generally brittle, so that reliability is improved compared to connections made by soldering. Particularly in small connections, the brittleness of the metal compounds in the connections causes great problems. According to a preferred embodiment, it is possible to achieve clearly smaller structures in a solderless solution than in soldered solutions. The solderless contact-making method also has the advantage that high temperatures are not required to form contacts. A lower process temperature permits greater choice when selecting other materials of the circuit board, the component package, or the electronics module. In the method, the temperature of the circuit board, the component, and the conductive layer directly connected to the component can be kept in the range 20-85° C. Higher temperatures, for example, of about 150° C., may be needed only when curing (polymerizing) the polymer films used. However, the temperature of the baseboard and the components can be kept under 200° C. during the entire process. If the method employs polymer films that are hardened in other ways than due to the effect of a high temperature, for example, chemically, or by electromagnetic radiation, the temperature of the baseboard and the components can, in a preferred embodiment, be kept under 100° C. during the entire process.

Because the use of the method permits the manufacture of smaller structures, the components can be spaced more closely. The conductors between the components can then also be shorter while the electrical properties of the electronic circuit improve, for example, by reducing losses, interference, and delay times.

The method also permits the manufacture of three-dimensional structures, as the bases and the components embedded in the bases can be assembled on top of each other.

In the method, it is also possible to reduce the interfaces between different metals.

The method permits a lead-free process.

The invention also permits other preferred embodiments. In connection with the invention, flexible circuit boards, for instance, can be used. Further, the process permits circuit boards to be assembled on top of each other.

With the aid of the invention, it is also possible to manufacture extremely thin structures, in which the semiconductor components are, despite its thinness, entirely protected within a base, such as a circuit board.

Because the semiconductor components can be placed entirely inside the circuit board, the joints between the circuit board and the semiconductor components are mechanically durable and reliable.

The embodiments provided possibilities to improve routing efficiency with lower price, in particular when it is aimed to increase the number of contacts of the components and narrow the pitch between the contact lands, or bumps, on the component.

BRIEF DESCRIPTION OF DRAWINGS

For a more complete understanding of the present invention and the advantages thereof, the invention is now described with the aid of the examples and with reference to the following drawings, in which:

FIG. 7A presents a cross profile view of the parts needed for an electronic module according to an embodiment of the invention manufactured by the third method.

FIG. 7B presents a cross profile view of an electronic module according to an embodiment of the invention manufactured by the third method.

FIGS. 8A, 8B, 8C, 8D and 8E are in the same scale.

MODES FOR CARRYING OUT THE INVENTION

Figure 1:
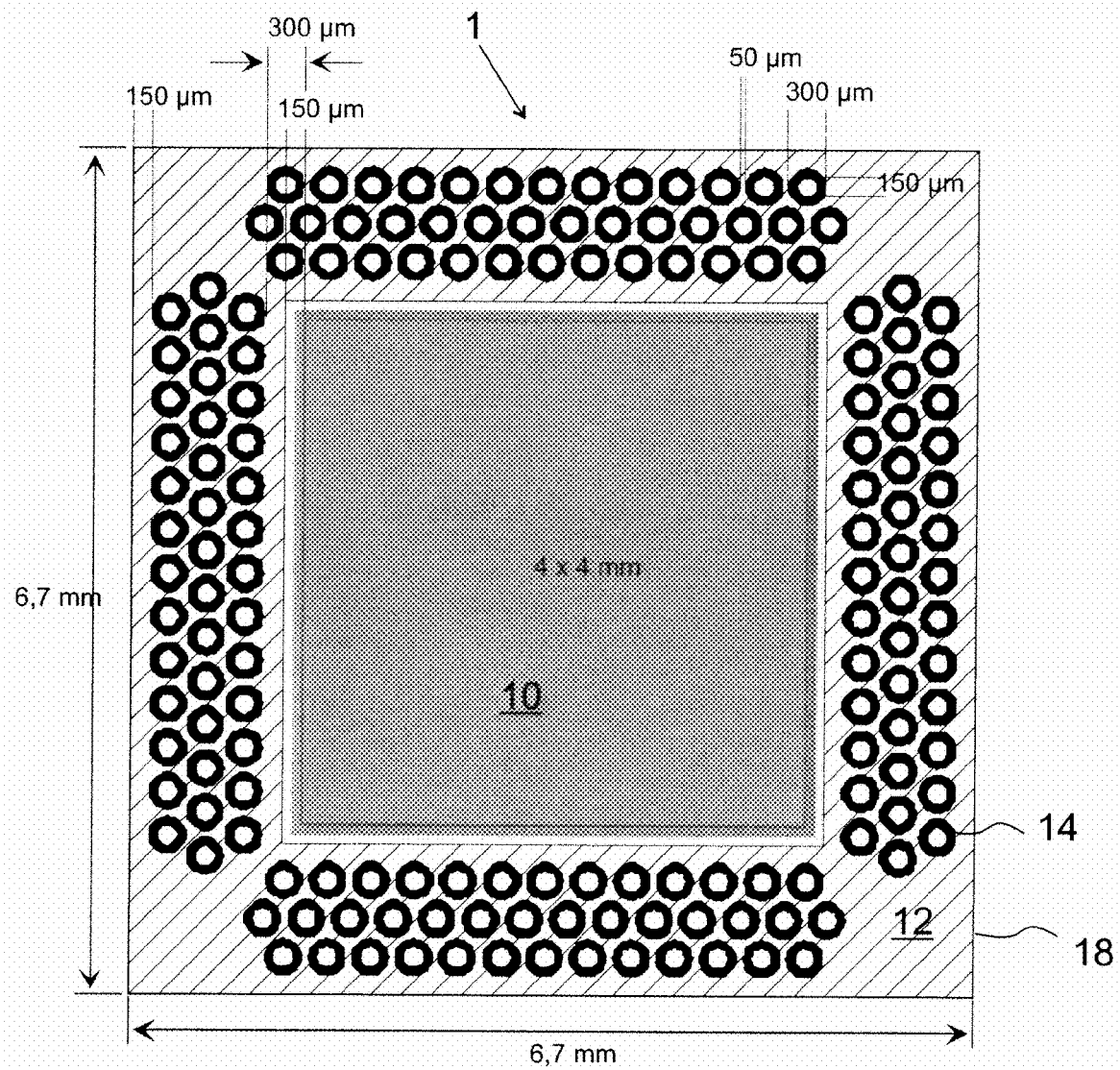
FIG. 1 presents a schematic top view of an electronic module footprint according to prior art.

According to an embodiment of the invention a feed through conductor component comprises of a dielectric to which an installation cavity is formed for a component to be embedded inside an electronic module. The dielectric may have conductive layers e.g. copper foils laminated on both sides of the dielectric. The installation cavity can be done by various methods. According to an embodiment of the invention first the feed through conductors are made by drilling through holes to the dielectric. The dielectric and the through holes are then metalized and patterned. Finally, the dielectric is routed preferably in the middle of metalized through holes so that an installation cavity will appear.

According to another embodiment of the invention first an installation cavity is routed for a component to be embedded inside an electronic module. After routing the dielectric will be metalized and patterned. Finally, feed through conductors will be separated by making openings to metalized dielectric e.g. by means of drilling or routing. In addition, the feed through conductor component normally includes one conductive layer. The conductive layer may be connected with each others, for example, by means of microvias, plated, buried or through holes. Conductive lines of a feed through conductor component do not have to be straight. The conductive lines can be loops, curves or even systems related functional design patterns such as antennas, grounds, EMI shields or like solutions. Furthermore, the conductive lines in different layers may be designed to go different directions (for example, 90 degrees to each other in every other layer).

It is not compulsory that conductors are in equal distance with each others on a feed through conductor component. There can be a dense group of feed through conductors locally at the ends, at particular place or in the corners of feed through conductor component, for example. Correspondingly, there can be a ground or an EMI shield in a middle of the feed through conductor component in the same example above. Furthermore, a component inside the electronic module can be EMI shielded totally according to an embodiment of the invention. Naturally, a dense group of conductors and ground can be located vice versa according to design requirements.

The electronic module may comprise a multi component application where the components are connected to each other with a feed through conductor component wherein the components can be located on top of each other or rear sides together with conductive pads to the same or opposite directions. Also in multilayer applications the feed through conductor component can be placed and connected with any conductive layers. The place (as well as the connections) inside an electronic module may not be symmetrical. Also the feed through conductor component may overtake one or more wiring layers in an electronic module.

A clearly reduced footprint of an electronic module can be achieved by a feed through conductor component according to the present design. By using a printed circuit board as a feed through conductor component a line/space of 30/30 can be easily achieved. With this measure it leads to a through hole pitch of 100 micrometers (µm) and even below. Compared to a normal printed circuit board the through hole pitch is typically 300-400 micrometers (µm). This means that the footprint area can easily be decreased by at least 25%, even 50%, less than used with prior art solutions such like plated through hole and laser pad means. The reduced footprint advantage is mostly gained with components having tens or even hundreds of contact pads.

Yet another advantage is achieved by designing a feed through conductor component as thick, long and shaped as required, thus extends from upper surface to lower surface without any limitations. With conventional mechanical through holes there is an aspect ratio requirement (typically 8:1, maximum 12:1) to prepare a uniform plating of the holes.

A reduced layer count of an electronic module can be achieved by a feed through conductor component. Because of high density connection pitch a reduced number of build-up layers are required or even no build-up layers at all.

A generous improved reliability can be achieved by a feed through conductor component. According to an embodiment of the invention a feed through conductor component of printed circuit board with copper (Cu) traces are full and uniform metal and thus very reliable when exposed on thermal cycling or drop testing. As comparison to normal buried through holes filled with epoxy and through holes with air.

The feed through conductor components can be prefabricated as any other electrical components such as microchips, processors, and just about any passive or active components. Due to this prefabrication, savings in manufacturing cost can easily be recognized. Also, just like other electrical components, all feed through conductor components can be inspected before assembling and embedding them. This gives additional cost savings through improved yield.

A semiconductor package can include one or more semiconductor chips in an electric module utilizing the feed through conductor components of the present invention. The invention is not limited to be used in context with embedded component but can be actually utilized with "conventional" printed circuit boards and substrates where IC's, discrete and all other component are assembled in conventional methods such as surface mount technology (SMT) for example.

FIG. 1 presents a schematic top view of an electronic module 1 according to the prior art. A component 10 needs 4 mm×4 mm space. The component 10 has one hundred and sixty contact pads that are directed via plated through holes 14. The plated through holes 14 are in a substrate 12 (e.g. FR4, PI or similar dielectric material). The through holes are at every side (four) of the component 10 in three rows. The inner and outer rows have thirteen PTHs and the middle rows have fourteen PTHs each. The total footprint area 18 with typical plated through holes design rules in this example is 6.7 mm×6.7 mm.

FIGS. 2A-2I present a first method for manufacturing a feed through conductor component according to an embodiment of the invention. All of the FIGS. 2A-2I comprise a top view figure on right hand side and a cross profile A-A' figure of the top view figure on left hand side.

Figure 2A:
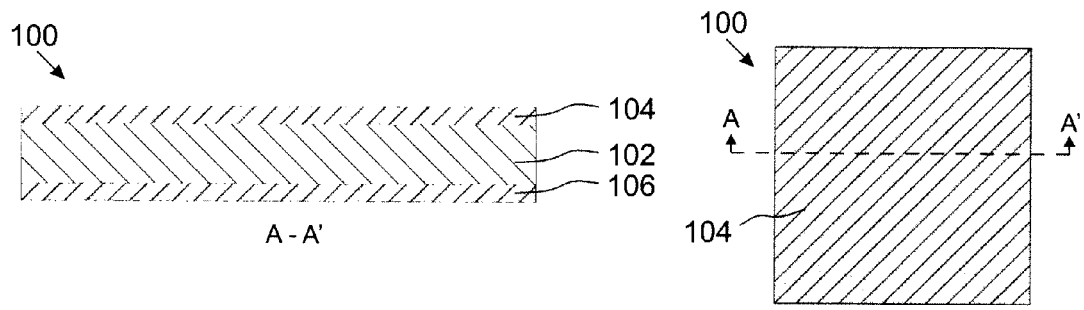
FIGS. 2A-2I present a first method for manufacturing a feed through conductors according to an embodiment of the invention.

FIG. 2A presents a panel of a feed through conductor component 100. The panel can be a layered board 100, for example a layered printed circuit board. The layered board 100 comprises of a core 102 which can be a dielectric and on both surfaces of the dielectric core 102 there are conductive layers, namely top conductive layer 104 and bottom conductive layer 106.

Figure 2B:
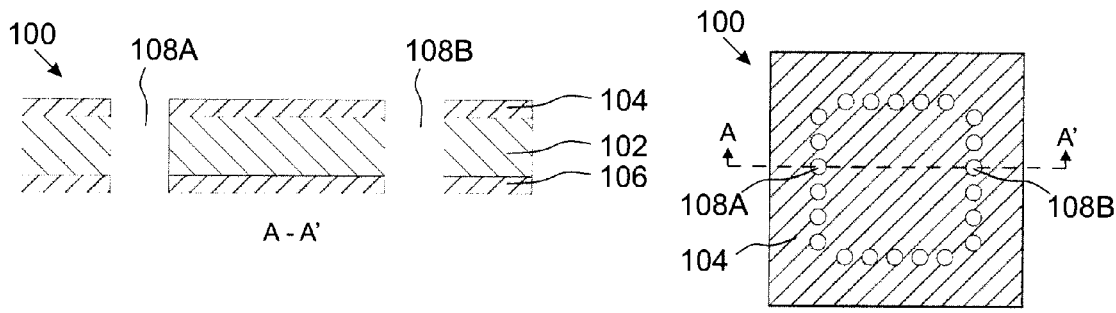

In the first method according to an embodiment holes for feed through conductors 108A and 108B are formed by drilling, punching, laser or like means through the whole layered board 100 in FIG. 2B.

Figure 2C:
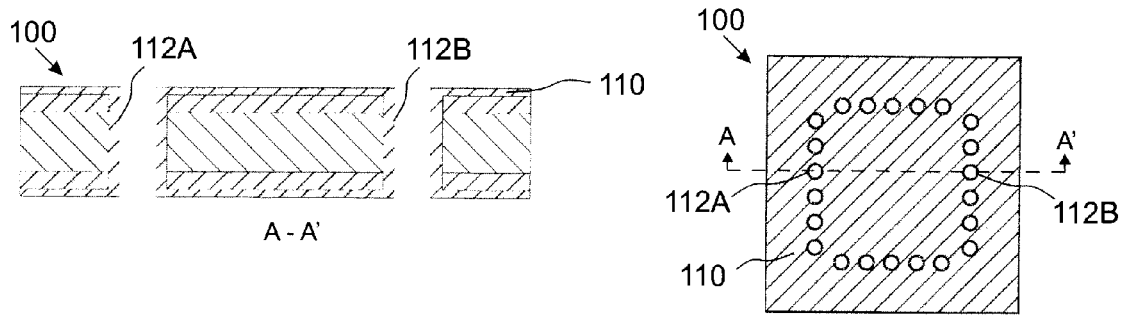

FIG. 2C presents a plating of feed through conductors. After forming the holes for feed through conductors 108A and 108B the holes are plated with conductive material 110. This is done in such way that the conductive material 110 covers all free surfaces of the layered board 100, also the surfaces of the holes 108A and 108B. After the plating process the holes are plated 112A and 112B with conductive material 110. This can be done for example by using electroless plating method.

Figure 2D:
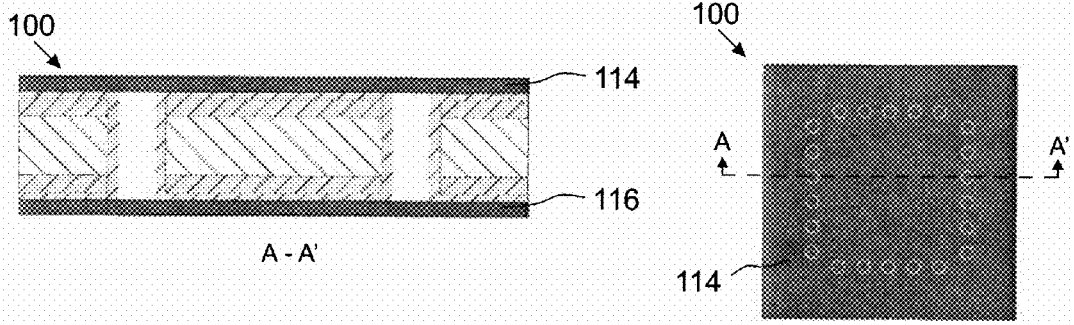

FIG. 2D presents a phase of forming a photo definable mask on both surfaces 114 and 116 of the layered board 100. The photo definable mask can be either positive or negative. A person skilled in the art knows the meaning and difference between the two and therefore these are not presented in this patent publication.

Figure 2E:
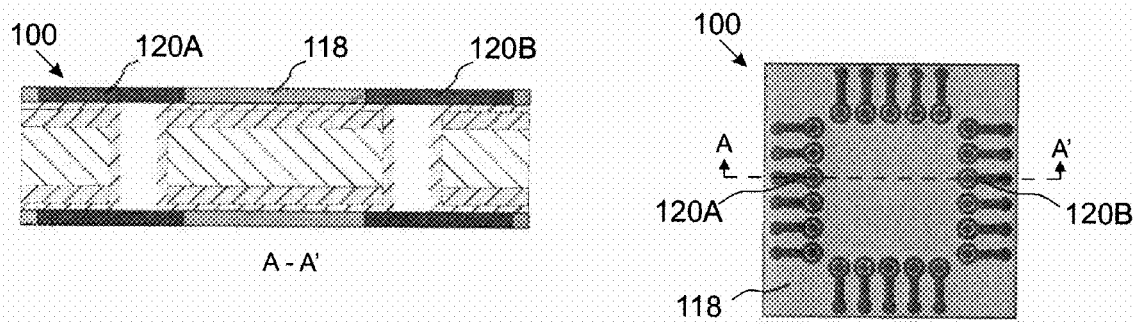

FIG. 2E presents a phase of exposing the photo definable masks 114 and 116 at the desired places 118 of the masks. In this embodiment a positive exposing process is used. This means that outside the exposing area 118 the photo definable masks 114 and 116 will be left at the places of the actual wiring patterns 120A and 120B of the layered board 100.

Figure 2F:
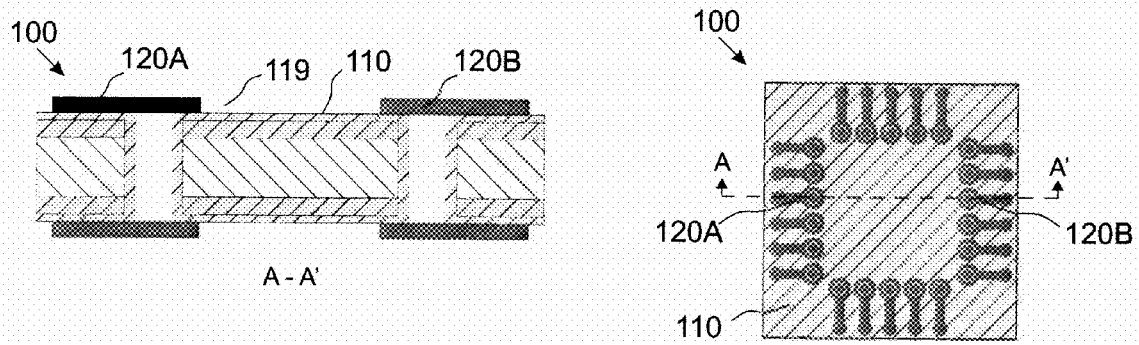

FIG. 2F presents a phase of dissolving 119 the photo definable masks 114 and 116 away from the desired places 118 and the at the same time the photo definable mask remains only on the surfaces where the actual wiring patterns 120A and 120B will be left.

Figure 2G:
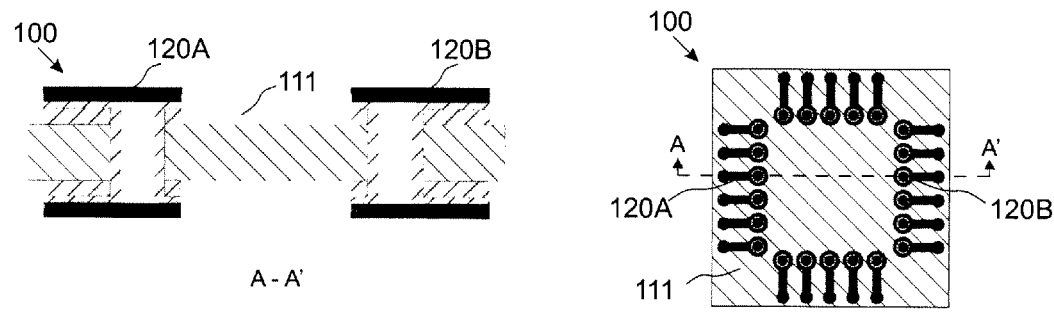

FIG. 2G present a phase of removing 111 the conductive surfaces at the desired places by e.g. etching.

Figure 2H:
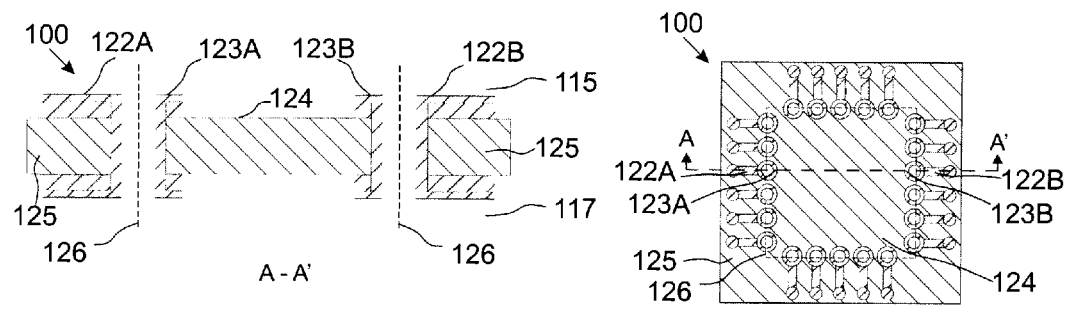

FIG. 2H presents a phase of stripping 115 and 117 the unexposed photo definable mask on the both surfaces of the layered board 100. A middle part of the layered board comprising the vertical halves of plated through holes 123A and 123B and dielectric 124 will be removed by e.g. routing line 126. The remaining parts of the feed through conductors comprise the dielectric core 125 and the conductors 122A and 122B running on the top surface of the dielectric, the conductors 132A and 132B running on the bottom surface of the dielectric and the feed through conductors 112A and 112B running on the vertical direction between the top and bottom surfaces of the dielectric 125.

Figure 2I:
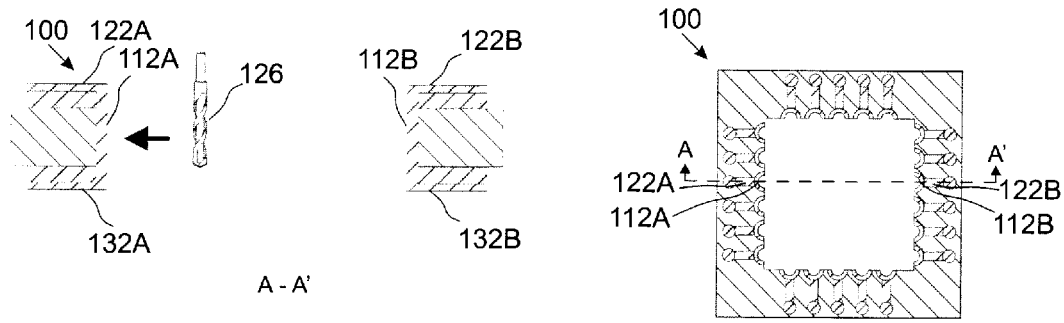

FIG. 2I presents a phase of routing 126 at the place of half way of the plated through holes. The routing can be done by means of mechanic or laser routing machines. After this phase the feed through conductor component 100 is ready for assembling an embedded semiconductor component together.

Figure 3A:
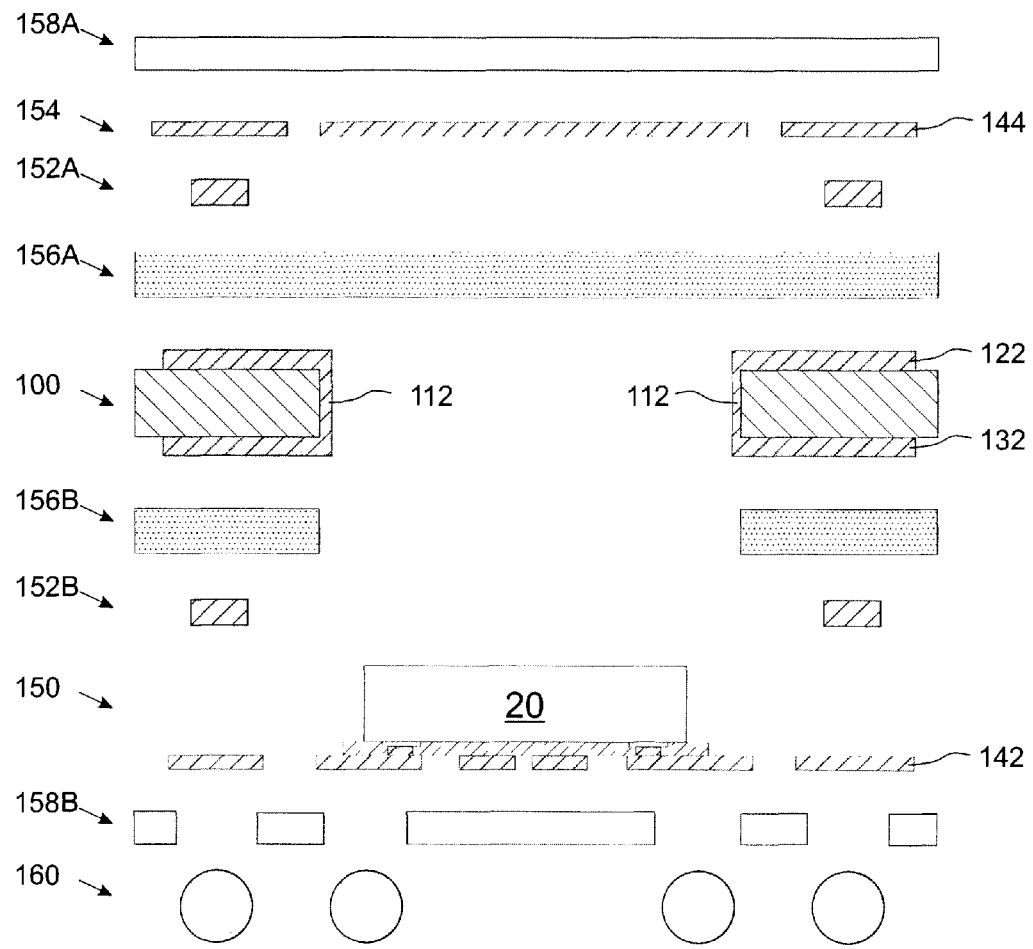
FIG. 3A presents a cross profile view of the parts needed for an electronic module according to an embodiment of the invention manufactured by the first method.

FIG. 3A presents a cross profile view of the parts and layers needed for an electronic module 2 according to an embodiment of the invention manufactured by the first method. The electronic module 2 comprises of the following parts and layers:

- A feed through conductor component 100 manufactured by the first method described in FIGS. 2A-2I containing the first 122 and second 132 wiring layers and feed through conductors 112 between the first 122 and the second 132 wiring layers;
- A pre-assembled body 150 including a component 20 on a patterned, third wiring layer 142 electrically connected via microvias 153;
- A fourth wiring layer 144 being at the topmost wiring layer;
- Microvia connections 152A and 152B mainly between the first 122 and the fourth 144 wiring layers as well as the second 132 and the third 142 wiring layers;
- Insulation material layers 156A and 156B;
- Passivation/solder mask layers 158A and 158B;
- Solder balls 160.

The pre-assembled body 150 can be done by various ways. These methods and structures (and at least some parts of them) are mainly described in the U.S. Pat. No. 6,991,966; U.S. Pat. No. 7,294,529; U.S. Pat. No. 7,299,546; U.S. Pat. No. 7,609,527; U.S. Pat. No. 7,663,215; U.S. Pat. No. 7,673, 387; U.S. Pat. No. 7,696,005 and in the U.S. Ser. No. 11/797, 609; U.S. Ser. No. 11/878,557; U.S. Ser. No. 12/603,324; U.S. Ser. No. 11/570,673; U.S. Ser. No. 11/667,429; U.S. Ser. No. 11/791,547; U.S. Ser. No. 11/587,586; U.S. Ser. No. 11/917,724; U.S. Ser. No. 11/917,711; U.S. Ser. No. 11/917, 737; U.S. Ser. No. 12/293,412; U.S. Ser. No. 12/506,519; U.S. Ser. No. 12/420,617 and U.S. Ser. No. 12/546,454 which are incorporated herein by reference.

Figure 3B:
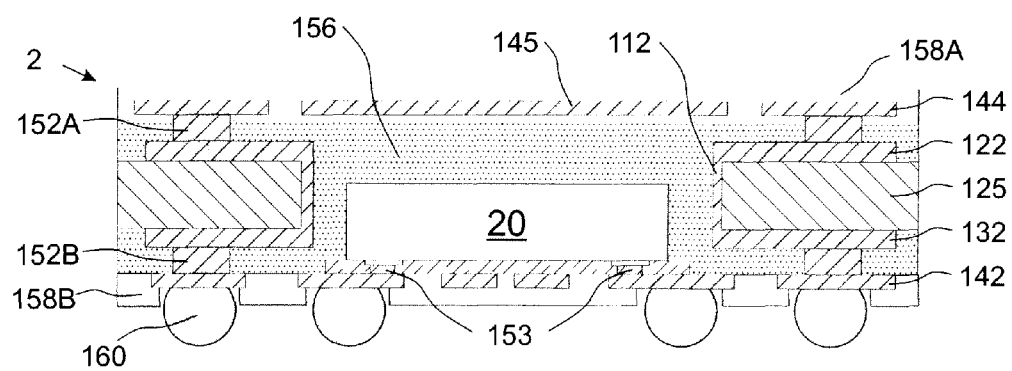
FIG. 3B presents a cross profile view of an electronic module according to an embodiment of the invention manufactured by the first method.

FIG. 3B presents a cross profile view of a readymade electronic module 2 including feed through conductor component 100 according to an embodiment of the invention manufactured by the first method. The feed through conductor component 100 is located substantially in the middle of the electronic module package 2. The electronic module 2 contains an embedded component 20 which is connected by microvias 153 to the third wiring layer 142. The fourth wiring layer 144 may also contain a functional feature 145 such like EMI shield or ground, for instance. The embedded component 20 is surrounded on all other sides than the third wiring layer 142 by an insulation material such as cured prepreg layers 156.

FIGS. 4A-4J present a second method for manufacturing a feed through conductors according to an embodiment of the invention. All of the FIGS. 4A-4J comprise a top view figure on right hand side and a cross profile A-A' figure of the top view figure on left hand side.

Figure 4A:
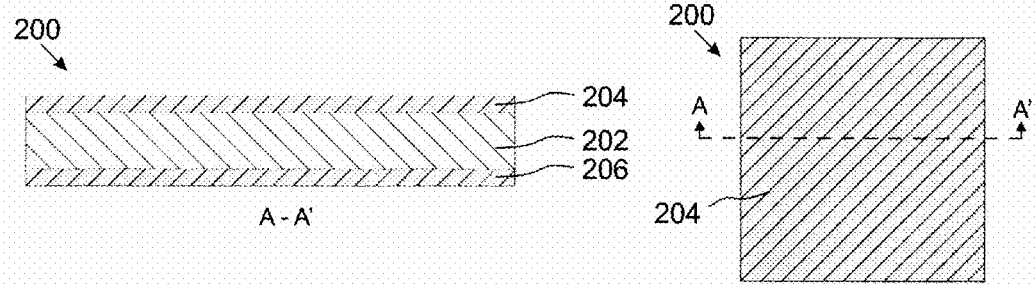
FIGS. 4A-4J present a second method for manufacturing a feed through conductors according to an embodiment of the invention.

FIG. 4A presents a panel of a feed through conductor component 200. The panel can be a layered board 200, for example a layered printed circuit board. The layered board 200 comprises of a core 202 which can be a dielectric and on both surfaces of the dielectric core 202 there are conductive layers, namely top conductive layer 204 and bottom conductive layer 206.

Figure 4B:
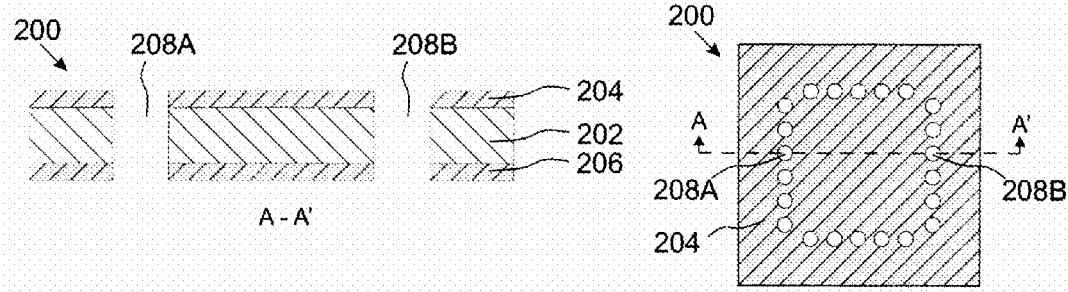

In the second method according to an embodiment holes for feed through conductors 208A and 208B are formed by drilling, punching, laser or like means through the whole layered board 200 in FIG. 4B.

Figure 4C:
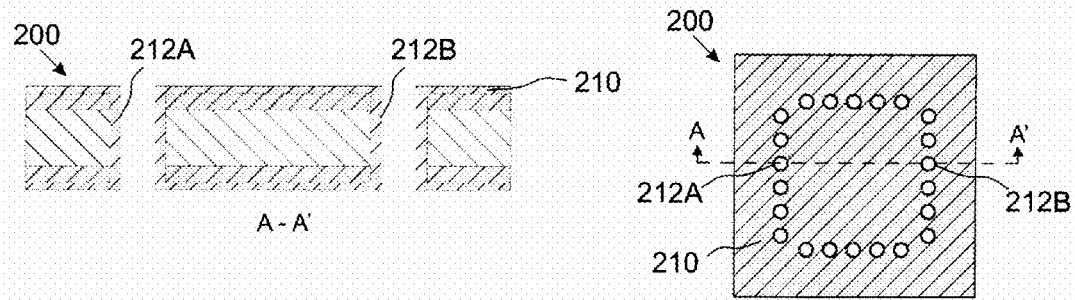

FIG. 4C presents a plating of feed through conductors. After forming the holes for feed through conductors 208A and 208B the holes are plated with conductive material 210. This is done in such way that the conductive material 210 covers all free surfaces of the layered board 200, also the surfaces of the holes 208A and 208B. After the plating process the holes are plated 212A and 212B with conductive material 210. This can be done for example by using electroless plating method.

Figure 4D:
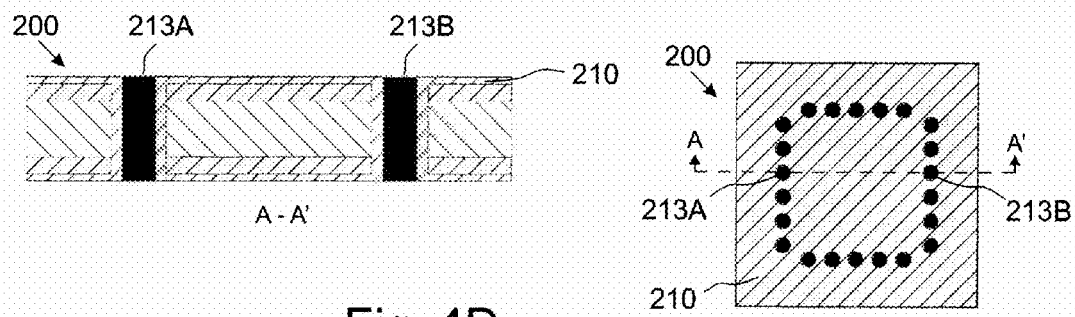

FIG. 4D presents a filling of the plated holes 208A and 208B by insulating material 213A and 213B. The filling can be for example permanent or durable plugging ink which can be afterwards milled by routing machine. The insulating material 213A and 213B makes possible to construct narrower conductors than the drilled through holes 208A and 208B.

Figure 4E:
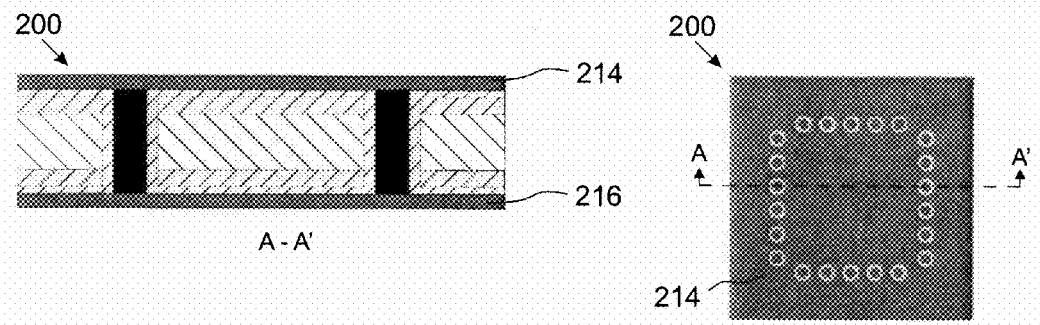

FIG. 4E presents a phase of forming a photo definable mask on both surfaces 214 and 216 of the layered board 200. The photo definable mask can be either positive or negative. A person skilled in the art knows the meaning and difference between the two and therefore these are not presented in this patent publication.

Figure 4F:
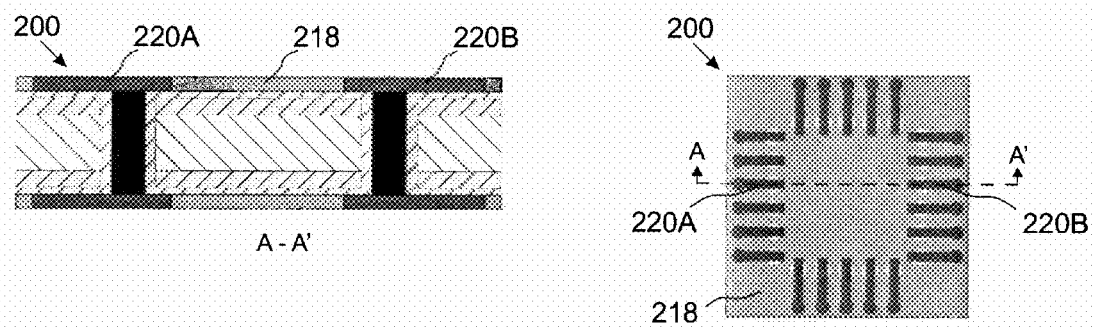

FIG. 4F presents a phase of exposing the photo definable masks 214 and 216 at the desired places 218 of the masks. In this embodiment a positive exposing process is used. This means that outside the exposing area 218 the photo definable masks 214 and 216 will be left at the places of the actual wiring patterns 220A and 220B of the layered board 200.

Figure 4G:
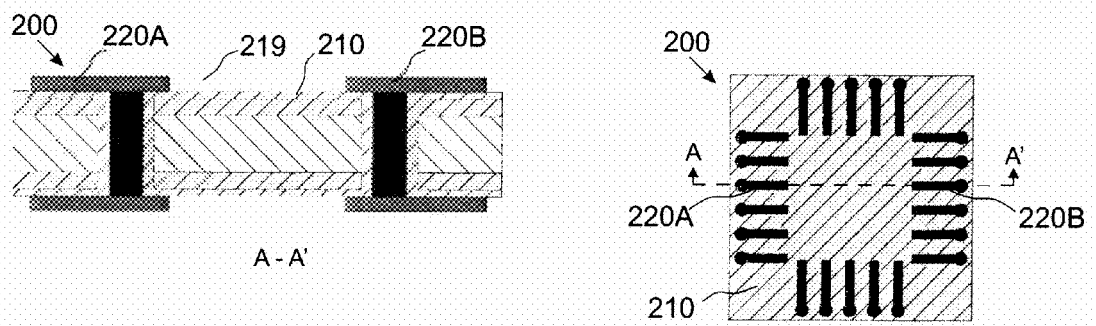

FIG. 4G presents a phase of dissolving 219 the photo definable masks 214 and 216 away from the desired places 218 and at the same time the photo definable mask remains only on the surfaces where the actual wiring patterns 220A and 220B will be left.

Figure 4H:
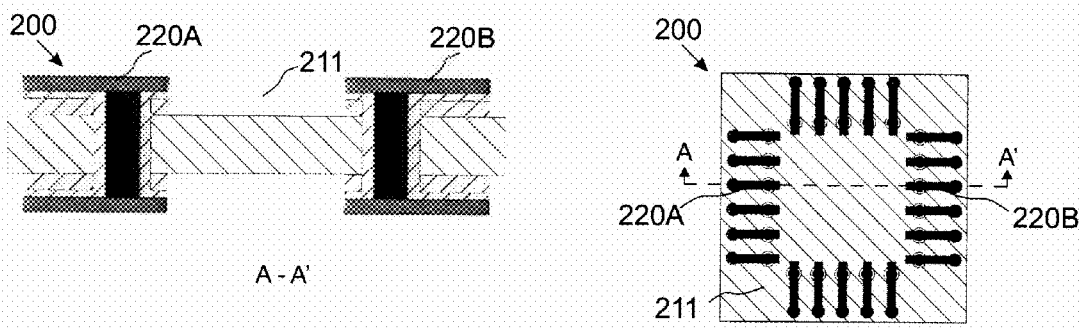

FIG. 4H present a phase of removing 211 the conductive surfaces at the desired places by e.g. etching.

Figure 4I:
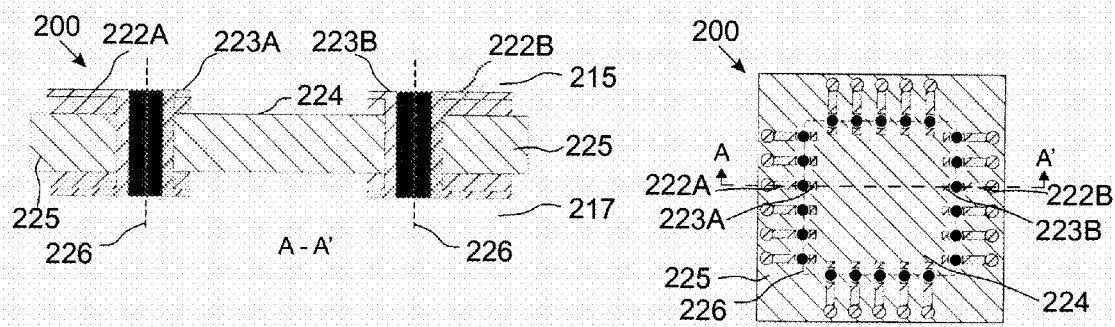

FIG. 4I presents a phase of stripping 215 and 217 the unexposed photo definable mask on the both surfaces of the layered board 200. A middle part of the layered board comprising of the vertical halves of insulating material filled 213A and 213B as well as plated through holes 223A and 223B and dielectric 224 will be removed by e.g. routing line 226. The remaining parts of the feed through conductors comprise the dielectric core 225 and the conductors 222A and 222B running on the top surface of the dielectric, the conductors 232A and 232B running on the bottom surface of the dielectric and the feed through conductors 212A and 212B running on the vertical direction between the top and bottom surfaces of the dielectric 225. The feed through conductors 212A and 212B are covered with the filled insulating materials 213A and 213B.

Figure 4J:
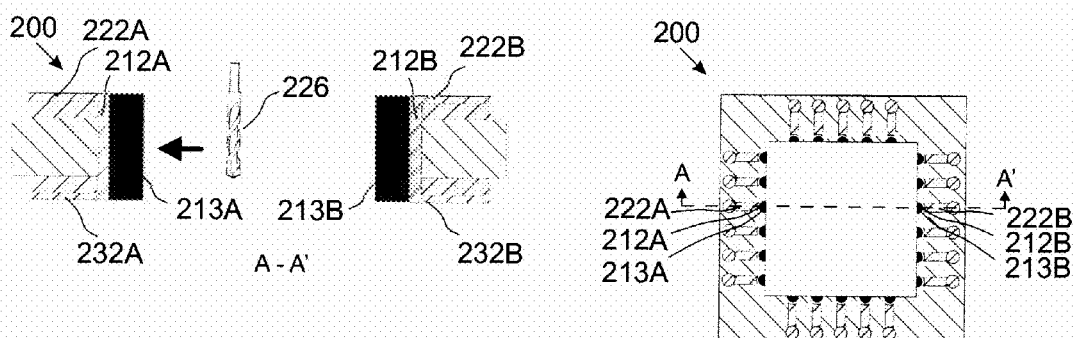

FIG. 4J presents a phase of routing 226 at the place of half way of the plated through holes. The routing can be done by means of mechanic or laser routing machines. After this phase the feed through conductor component 200 is ready for assembling an embedded semiconductor component together.

Figure 5A:
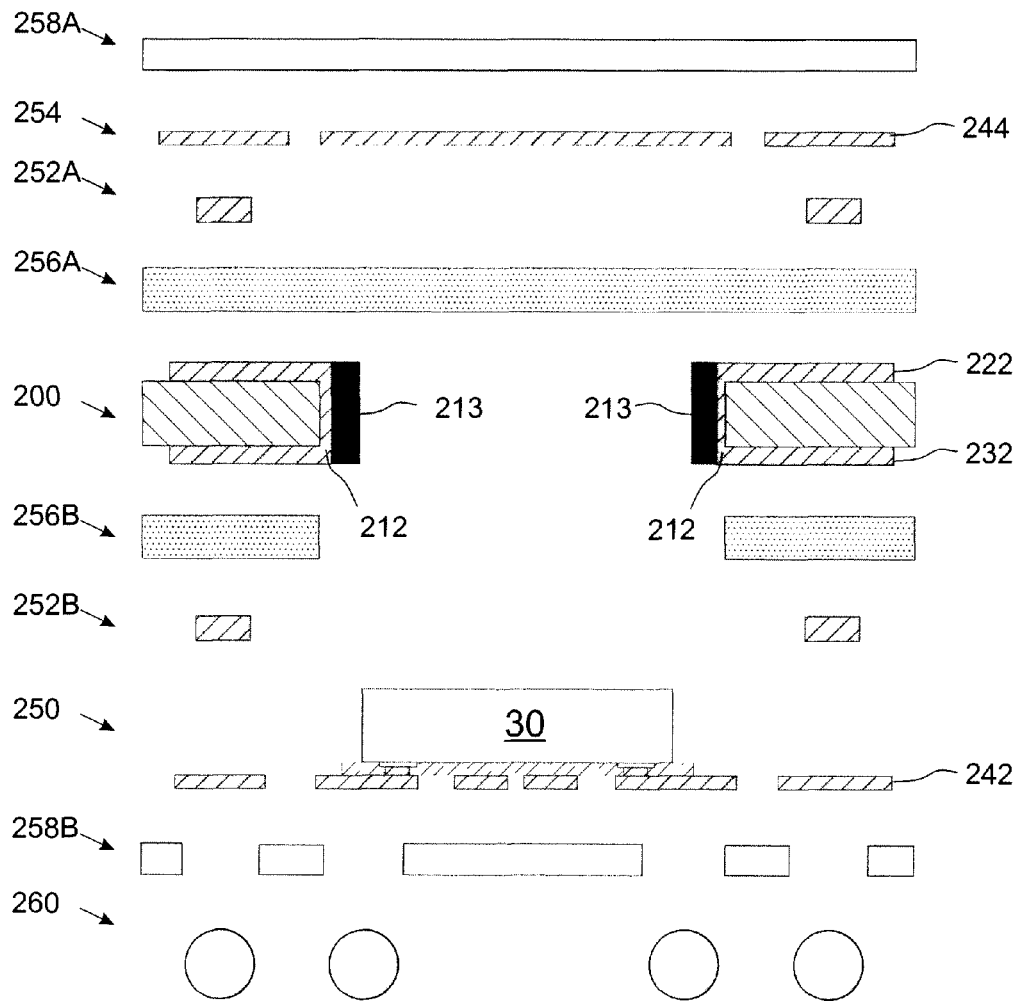
FIG. 5A presents a cross profile view of the parts needed for an electronic module according to an embodiment of the invention manufactured by the second method.

FIG. 5A presents a cross profile view of the parts and layers needed for an electronic module 3 according to an embodiment of the invention manufactured by the second method. The electronic module 3 comprises the following parts and layers:

- A feed through conductor component 200 manufactured by the second method described in FIGS. 4A-4J containing the first 222 and second 232 wiring layers and feed through conductors 212 between the first 222 and the second 232 wiring layers. The feed through conductors 212 are covered with the filled insulating material blocks 213;
- A pre-assembled body 250 including a component 20 on a patterned, third wiring layer 242 electrically connected via microvias 253;
- A fourth wiring layer 244 being at the topmost wiring layer;
- Microvia connections 252A and 252B mainly between the first 222 and the fourth 244 wiring layers as well as the second 232 and the third 242 wiring layers;
- Insulation material layers 256A and 256B;
- Passivation/solder mask layers 258A and 258B;
- Solder balls 260.

The pre-assembled body 250 can be done by various ways, confer the description of the first embodiment and FIG. 3A.

Figure 5B:
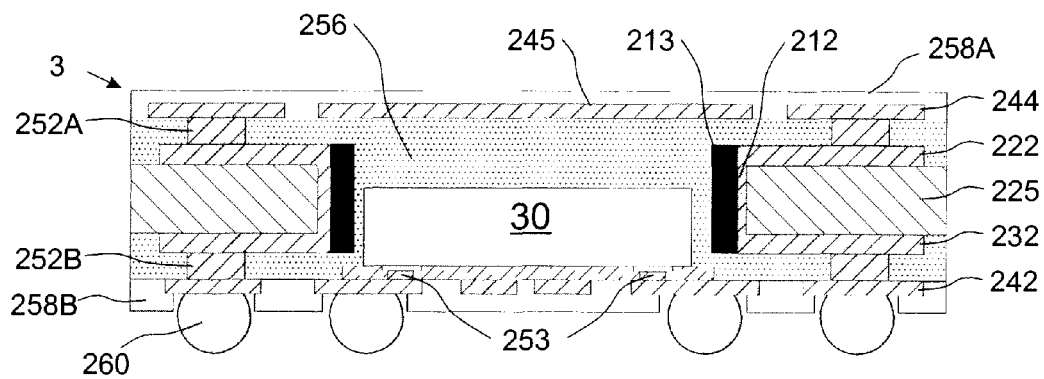
FIG. 5B presents a cross profile view of an electronic module according to an embodiment of the invention manufactured by the second method.

FIG. 5B presents a cross profile view of a readymade electronic module 3 including feed through conductor component 200 according to an embodiment of the invention manufactured by the second method. The feed through conductor component 200 is located substantially in the middle of the electronic module package 3. The electronic module 3 contains an embedded component 30 which is connected by microvias 253 to the third wiring layer 242. The fourth wiring layer 244 may also contain a functional feature 245 such like EMI shield or ground, for instance. The embedded component 30 is surrounded on all other sides than the third wiring layer 242 by an insulation material such as cured prepreg layers 256.

FIGS. 6A-6I present a third method for manufacturing a feed through conductors according to an embodiment of the invention. All of the FIGS. 6A-6I comprise a top view figure on right hand side and a cross profile A-A' figure of the top view figure on left hand side.

Figure 6A:
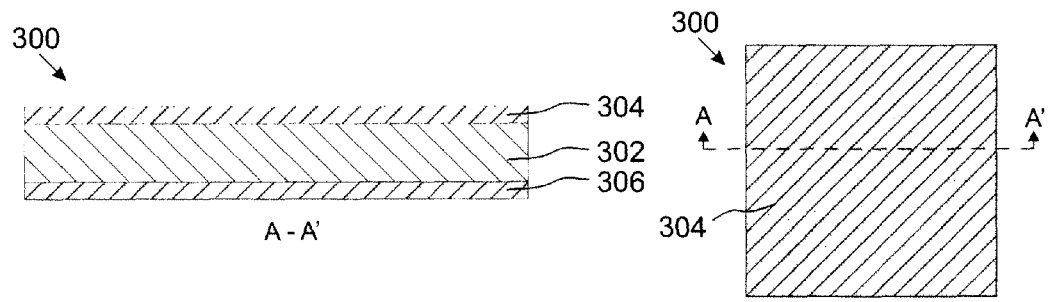
FIGS. 6A-6I present a third method for manufacturing a feed through conductors according to an embodiment of the invention.

FIG. 6A presents a panel of a feed through conductor component 300. The panel can be a layered board 300, for example a layered printed circuit board. The layered board 300 comprises a core 302 which can be a dielectric and on both surfaces of the dielectric core 302 there are conductive layers, namely top conductive layer 304 and bottom conductive layer 306.

Figure 6B:
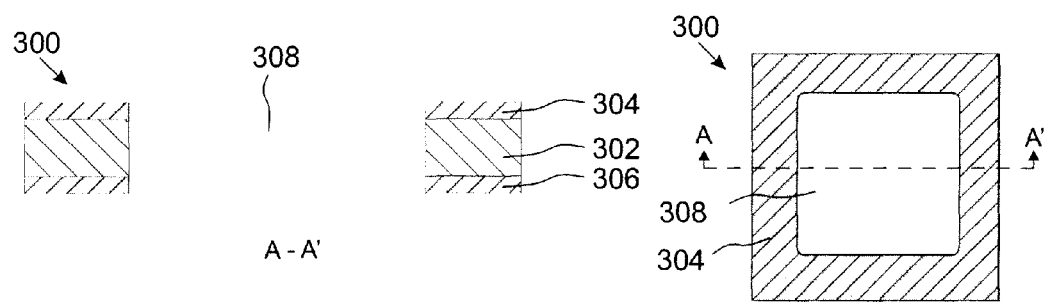

In the third method according to an embodiment a hole 308 for a component 40 to be embedded and for feed through conductors is formed by routing, punching, laser or like means through the whole layered board 300 in FIG. 6B.

Figure 6C:
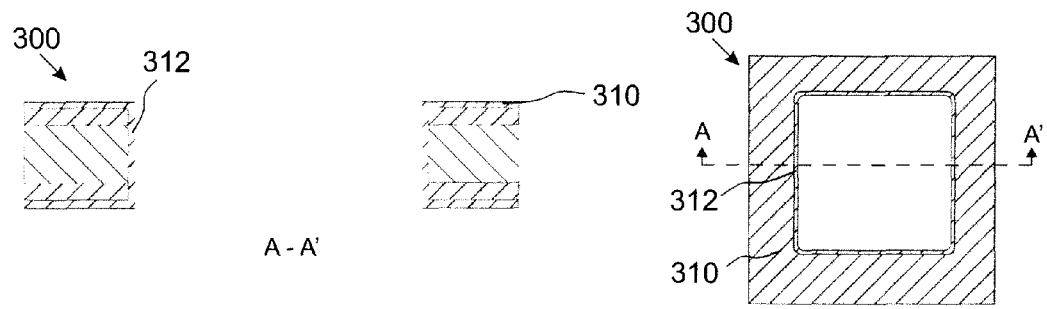

FIG. 6C presents a plating of the hole 308. Also the conductive layers 304 and 306 will be plated with conductive material 310. After the plating process the hole 308 is plated 312 with conductive material 310. This can be done for example by using electroless plating method.

Figure 6D:
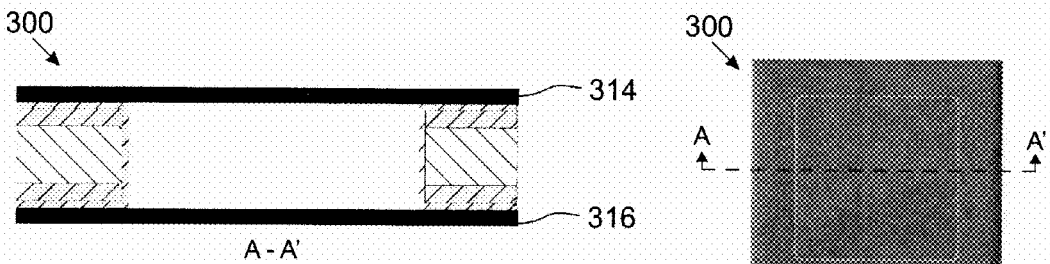

FIG. 6D presents a phase of forming a photo definable mask on both surfaces 314 and 316 of the layered board 300. The photo definable mask can be either positive or negative. A person skilled in the art knows the meaning and difference between the two and therefore these are not presented in this patent publication.

Figure 6E:
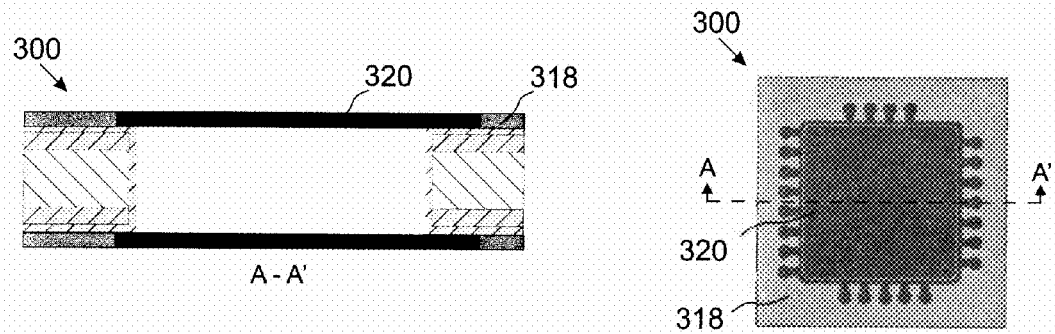

FIG. 6E presents a phase of exposing the photo definable masks 314 and 316 at the desired places 318 of the masks. In this embodiment a positive exposing process is used. This means that outside the exposing area 318 the photo definable masks 314 and 316 will be left at the places of the actual wiring pattern 320 of the layered board 300.

Figure 6F:
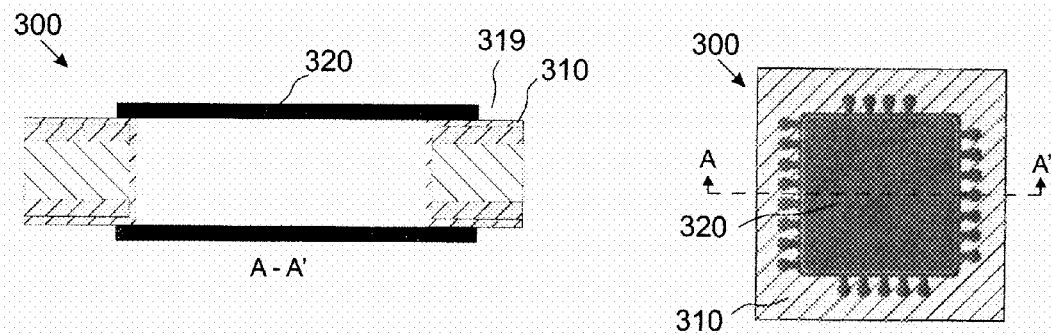

FIG. 6F presents a phase of dissolving 319 the photo definable masks 314 and 316 away from the desired places 318 and the at the same time the photo definable mask remains only on the surfaces where the actual wiring pattern 320 will be left.

Figure 6G:
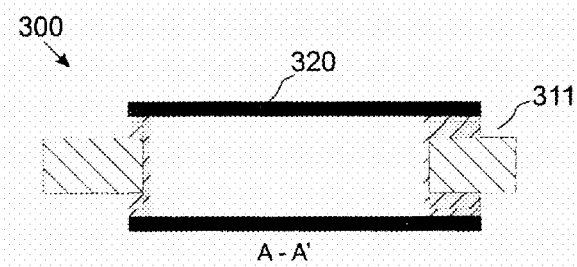
Figure 6G:
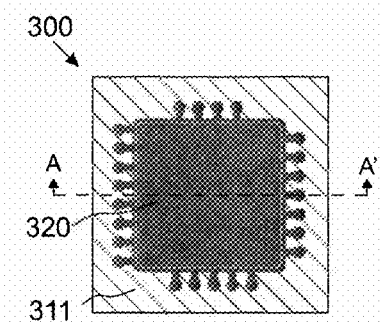

FIG. 6G present a phase of removing 311 the conductive surfaces at the desired places by e.g. etching.

Figure 6H:
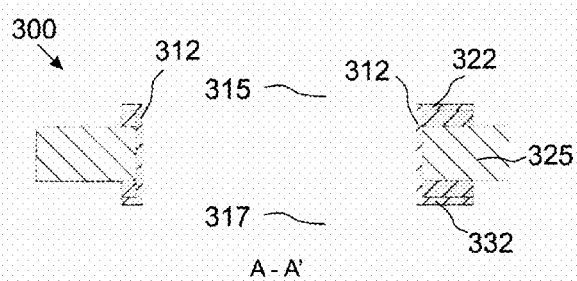
Figure 6H:
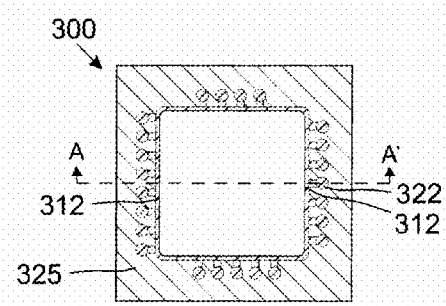

FIG. 6H presents a phase of stripping 315 and 317 the unexposed photo definable mask on the both surfaces of the layered board 300. After stripping the unified plated 312 hole 308 reveals under the unexposed photo definable masks. On left hand side there is not needed any feed through conductor and an opening 328 will be removed afterwards. On right hand side a feed through conductor 312 is needed. The layered board 300 comprises the dielectric core 325 and conductors 322 running on the top surface of the dielectric 325, conductors 332 running on the bottom surface of the dielectric 325 and feed through conductors 312 running on the vertical direction between the top and bottom surfaces of the dielectric 325.

Figure 6I:
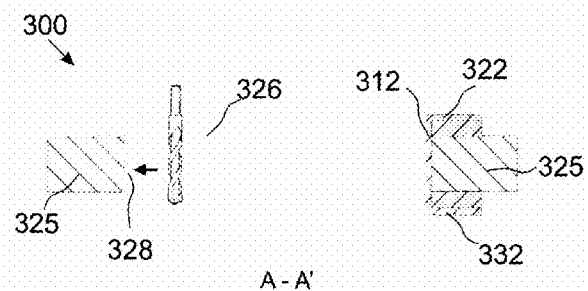
Figure 6I:
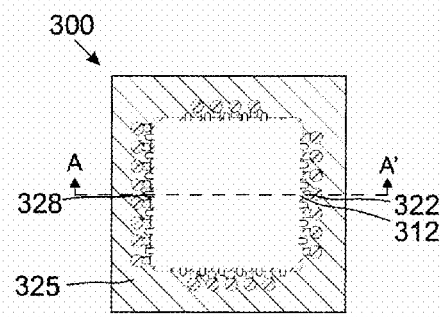

FIG. 6I presents a phase of forming 326 the feed through conductors 312 at desired places by making openings 328 to the unified plated 312 hole 308. The openings 328 can be formed 326 by drilling, routing, laser or other like means. After this phase the feed through conductor component 300 is ready for assembling an embedded semiconductor component together.

FIG. 7A presents a cross profile view of the parts and layers needed for an electronic module 4 according to an embodiment of the invention manufactured by the third method. The electronic module 4 comprises the following parts and layers:

- A feed through conductor component 300 manufactured by the third method described in FIGS. 6A-6I containing the first 322 and second 332 wiring layers and feed through conductors 312 between the first 322 and the second 332 wiring layers;
- A pre-assembled body 350 including a component 40 on a patterned, third wiring layer 342 electrically connected via microvias 353;
- A fourth wiring layer 344 being at the topmost wiring layer;
- Microvia connections 352A and 352B mainly between the first 322 and the fourth 344 wiring layers as well as the second 332 and the third 342 wiring layers;
- Insulation material layers 356A and 356B;
- Passivation/solder mask layers 358A and 358B;
- Solder balls 360.

The pre-assembled body 350 can be done by various ways, confer the description of the first embodiment and FIG. 3A.

FIG. 7B presents a cross profile view of a readymade electronic module 4 including feed through conductor component 300 according to an embodiment of the invention manufactured by the third method. The feed through conductor component 300 is located substantially in the middle of the electronic module package 4. The electronic module 4 contains an embedded component 40 which is connected by microvias 353 to the third wiring layer 342. The fourth wiring layer 344 may also contain a functional feature 345 such like EMI shield or ground, for instance. The embedded component 40 is surrounded on all other sides than the third wiring layer 342 by an insulation material such as cured prepreg layers 356.

Figures 8A, 8B, 8C, 8D, 8E:
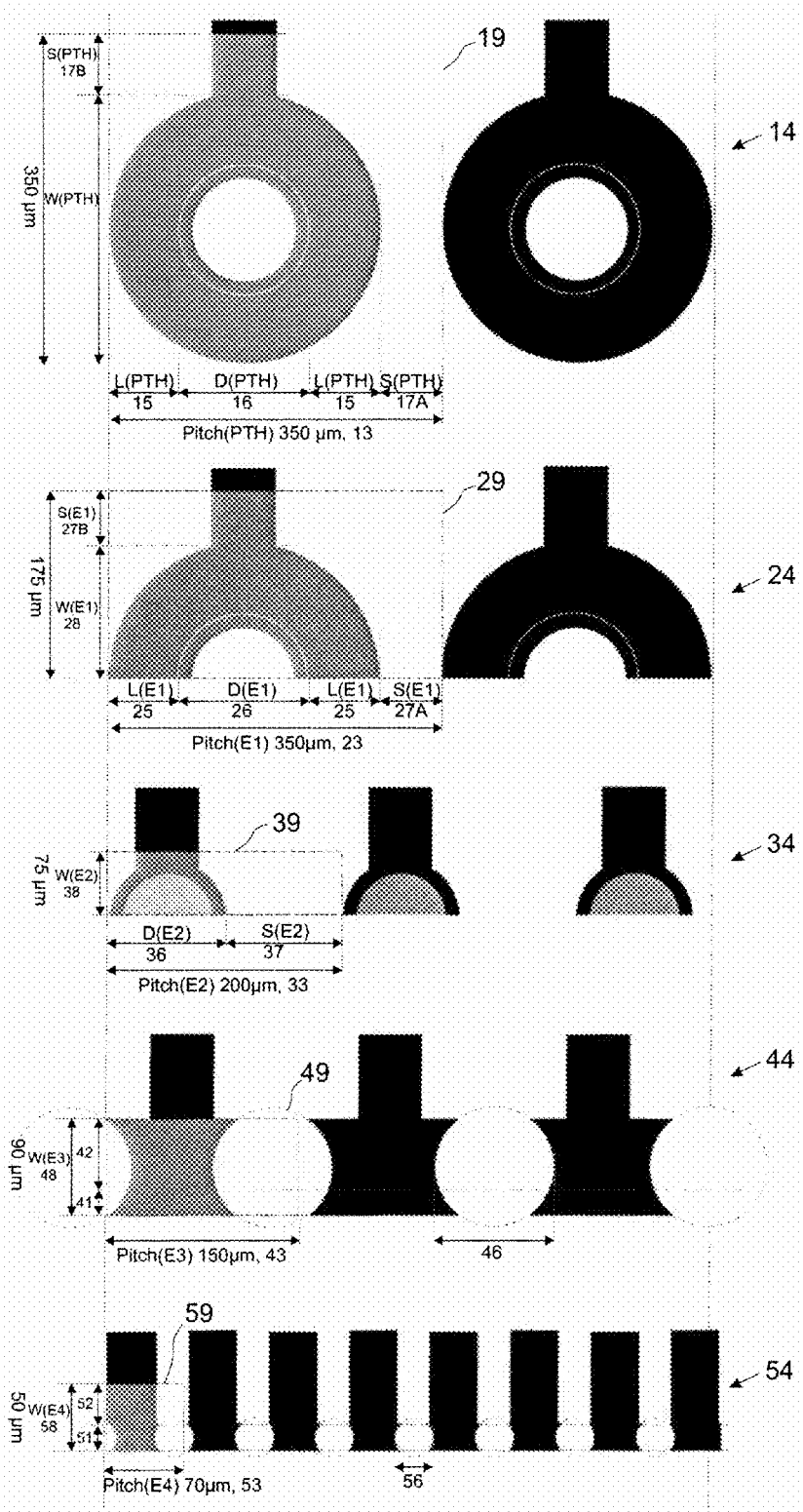
FIG. 8A presents a top view of two plated through holes according to prior art.
FIG. 8B presents a top view of two feed through conductors according to the first embodiment of the invention.
FIG. 8C presents a top view of three feed through conductors according to the second embodiment of the invention.
FIG. 8D presents a top view of three feed through conductors according to the third embodiment of the invention.
FIG. 8E presents a top view of eight feed through conductors according to the third embodiment of the invention.

FIG. 8A presents a schematic top view of two plated through holes 14 according to the prior art. One plated through hole 14 needs typically 300 µm space W(PTH) for landing L(PTH) 15 (typical radius 75 µm) and for the actual hole D(PTH) 16 (typical diameter 150 µm). The plated through holes 14 need typically 50 µm free space S(PTH) 17A to next through hole. The same measure (S(PTH)) can be count also for a conductor 17B running on a wiring layer. Therefore the pitch 13 of a plated through hole (Pitch(PTH)) is typically 350 µm and the area 19 needed for one contact through a dielectric layer is approximately 350 µm×350 µm.

FIG. 8B presents a top view of two feed through conductors according to the first embodiment of the invention. According to the first embodiment of the invention the plated through holes will be split to half. One feed through conductor, i.e. split plated through hole, 24 needs typically 150 µm space W(E1) 28 for landing L(E1) 25 (typical radius 75 µm) and for the actual hole D(E1) 26 (typical diameter 150 µm). The split plated through holes 24 need typically 50 µm free space S(E1) 27A to next split through hole. The same measure (S(E1)) can be count also for a conductor 27B running on a wiring layer. Therefore the pitch 23 of a split plated through hole (Pitch (E1)) is typically 350 µm and the area 29 needed for one feed through conductor according to the first embodiment of the invention is approximately 350 µm×200 µm. Therefore, the first embodiment of the invention decreases the needed feed through conductor area 29 to half when compared to the prior art.

FIG. 8C presents a top view of three feed through conductors according to the second embodiment of the invention. According to the second embodiment of the invention one feed through conductor 34 needs typically 75 µm space W(E2) 38. Because of any landing is not needed the only remarkable issue is the actual hole D(E2) 36 (typical diameter 100 µm). The second embodiment of the feed through conductor 34 needs typically 100 µm free space S(E2) 37 to next feed through conductor. Any measure for conductors like in the first embodiment (27B) is not needed due to enough width free space 37. Therefore the pitch 33 of a feed through conductor (Pitch(E2)) is typically 200 µm and the area 39 needed for one feed through conductor according to the second embodiment of the invention is approximately 200 µm×75 µm. Therefore, the second embodiment of the invention decreases the needed feed through conductor area 39 by 85% compared to the prior art.

FIG. 8D presents a top view of three feed through conductors according to the third embodiment of the invention. According to the third embodiment of the invention one feed through conductor 44 needs typically 90 µm space W(E3) 48. The space W(E3) 48 comprises of the vertical conductor 41 (which corresponds to reference number 312 in FIGS. 6I and 7B, for example) of typical value 15 µm and the conductor running on top or bottom surface of the dielectric 42 (which corresponds to reference numbers 322 or 332 in FIGS. 6I and 7B, for example) of typical value 75 µm. Therefore, the total space W(E3) 48 needed for a feed through conductor is typically 90 µm. The third embodiment of the feed through conductor 44 needs not any type of free space like the previous embodiments. It is only needed that an opening is formed all the desired places where there are no conductors 41 and 42 (which correspond to reference numbers 312, 322 and 332 in FIGS. 6I and 7B, for example) present. In this embodiment a hole 46 is drilled through the feed through conductor component for making an opening and separating the feed through conductors from each other. Furthermore, the pitch 43 of a feed through conductor (Pitch(E3)) is typically 150 µm and the area 49 needed for one feed through conductor according to the third embodiment of the invention is approximately 150 µm×90 µm. Therefore, the third embodiment of the invention decreases the needed feed through conductor area 49 by almost 90% with regard to the prior art.

FIG. 8E presents a top view of eight feed through conductors according to another, advanced third embodiment of the invention. According to the advanced third embodiment of the invention one feed through conductor 54 needs typically 50 µm space W(E4) 58. The space W(E4) 58 comprises of the vertical conductor 51 (which corresponds to reference number 312 in FIGS. 6I and 7B, for example) of typical value 15 µm and the conductor running on top or bottom surface of the dielectric 42 (which corresponds to reference numbers 322 or 332 in FIGS. 6I and 7B, for example) of typical value 35 µm. Therefore, the total space W(E4) 58 needed for a feed through conductor is typically 50 µm. The advanced third embodiment of the feed through conductor 54 needs not any type of free space like the first and second embodiments. It is only needed that an opening is formed all the desired places where there are no conductors 41 and 42 (which correspond to reference numbers 312, 322 and 332 in FIGS. 6I and 7B, for example) present. In this embodiment a hole 56 is drilled through the feed through conductor component for making an opening and separating the feed through conductors from each other. Furthermore, the pitch 53 of a feed through conductor (Pitch(E4)) is typically 70 µm and the area 59 needed for one feed through conductor according to the third embodiment of the invention is approximately 70 µm×50 µm. Therefore, the third embodiment of the invention decreases the needed feed through conductor area 59 by almost 97% with regard to the prior art. It should be noted that FIGS. 8A, 8B, 8C, 8D and 8E are in the same scale.

In all FIGS. 9A-9E the reference numbers are the same. The different types of feed through conductors 64 are presented. In the embodiments the total space 68 needed for feed through conductor comprises of a vertical conductor part 61 (which corresponds to reference number 312 in FIGS. 6I and 7B, for example) and a conductor running on top or bottom surface part of the dielectric 62 (which corresponds to reference numbers 322 or 332 in FIGS. 6I and 7B, for example). The separated vertical conductors are made by an opening to a plated unified vertical conductor by means of mechanical routing or drilling means. The pitch 63 of a feed through conductor 64 can be affected by choosing a distance of conductors running on top or bottom surface part of the dielectric, a width of line 67 and/or space 69 and a diameter of a drilling or routing tool 66.

Figures 9A, 9B, 9C, 9D, 9E:
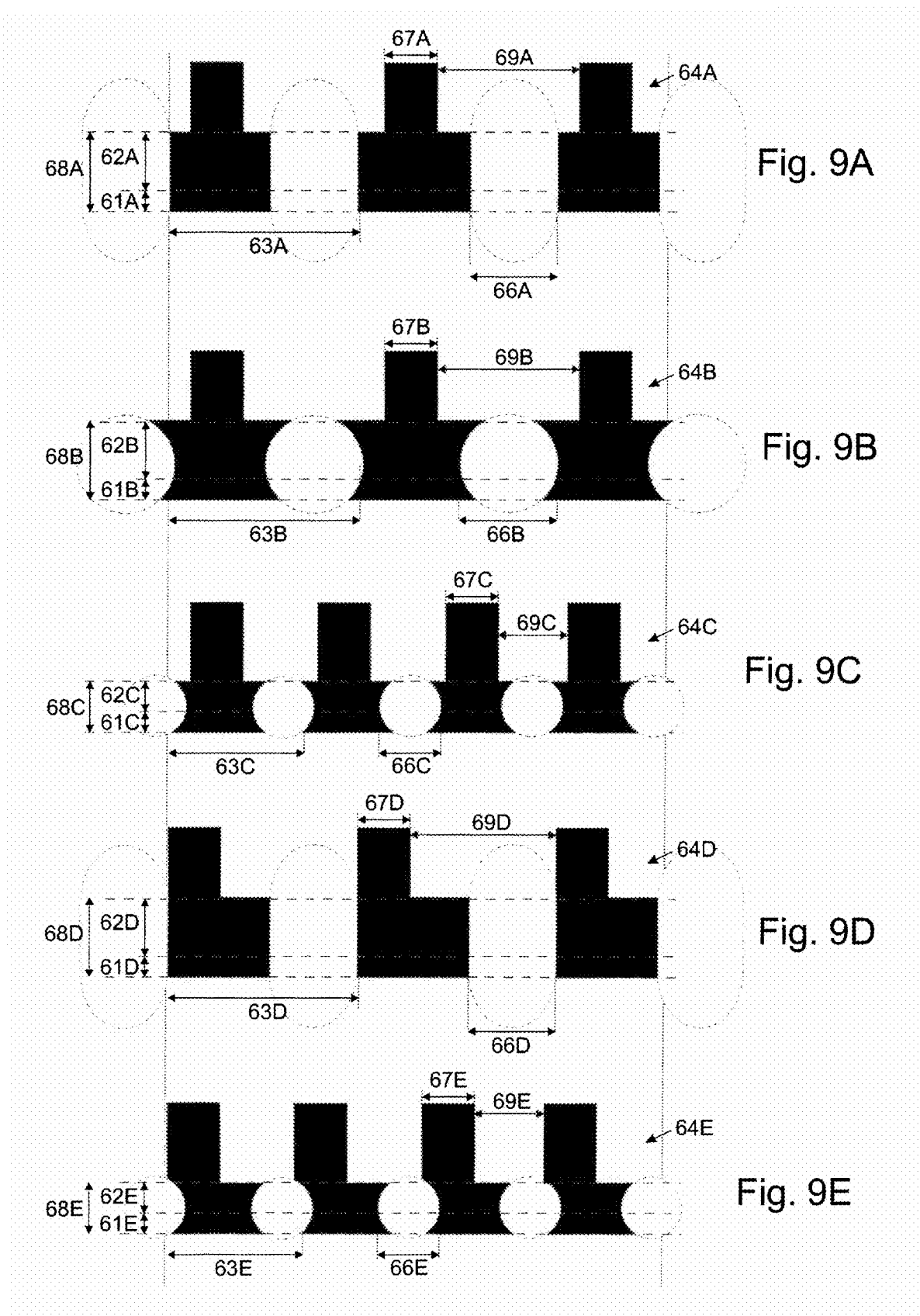
FIG. 9A presents an example of mechanically routing finished feed through conductors according to the third embodiment of the invention.
FIG. 9B presents an example of mechanically drilling finished feed through conductors according to the third embodiment of the invention.
FIG. 9C presents another example of mechanically drilling finished feed through conductors according to the third embodiment of the invention.
FIG. 9D presents another example of mechanically routing finished feed through conductors according to the third embodiment of the invention.
FIG. 9E presents yet another example of mechanically drilling finished feed through conductors according to the third embodiment of the invention.

FIG. 9A presents an example of mechanically routing finished feed through conductors according to the third embodiment of the invention. As an example of typical mechanic routing is done in the middle of the conductors running on top or bottom surface part of the dielectric to make an opening in a vertical conductor part 61. In FIG. 9D is presented another type of routing which conforms a L-type of feed through conductor. In the current routing means a typical value for a line width 67 is approximately 50 µm and for a space is approximately 150 µm. In advanced embodiments the respective values are 40 µm and 100 µm, for instance. The pitch 63 for typical embodiments is approximately 200 µm and advanced embodiments 140 µm.

FIG. 9B presents an example of mechanically drilling finished feed through conductors according to the third embodiment of the invention. As an example, a typical mechanic drilling is done in the middle of the conductors running on top or bottom surface part of the dielectric to make an opening in a vertical conductor part 61. FIG. 9C presents an example of an advanced mechanic drilling of feed through conductors according to the third embodiment of the invention. In FIG. 9E is presented another type of advanced drilling which conforms a L-type of feed through conductor. In the current drilling means a typical value for a line width 67 is approximately 50 μm and for a space is approximately 100-150 μm. In advanced embodiments the respective values are 40 μm and 75 μm, for instance. The pitch 63 for typical embodiments is approximately 150-200 μm and advanced embodiments 115 μm.

In all FIGS. 10A-10E the reference numbers are the same. The different types of feed through conductors 74 are presented. In the embodiments the total space 78 needed for feed through conductor comprises of a vertical conductor part 71 (which corresponds to reference number 312 in FIGS. 6I and 7B, for example) and a conductor running on top or bottom surface part of the dielectric 72 (which corresponds to reference numbers 322 or 332 in FIGS. 6I and 7B, for example). The separated vertical conductors are made by an opening to a plated unified vertical conductor by means of laser drilling means. The pitch 73 of a feed through conductor 74 can be affected by choosing a distance of conductors running on top or bottom surface part of the dielectric, a width of line 77 and/or space 79 and a diameter of a beam of laser drilling tool 76. In all FIGS. 10A-10E there is also presented a combined feed through conductor 75 wherein at place a conductor separation is not made. This allows also some more freedom for designing an electronic module according to an embodiment of the invention.

Figures 10A, 10B, 10C, 10D, 10E:
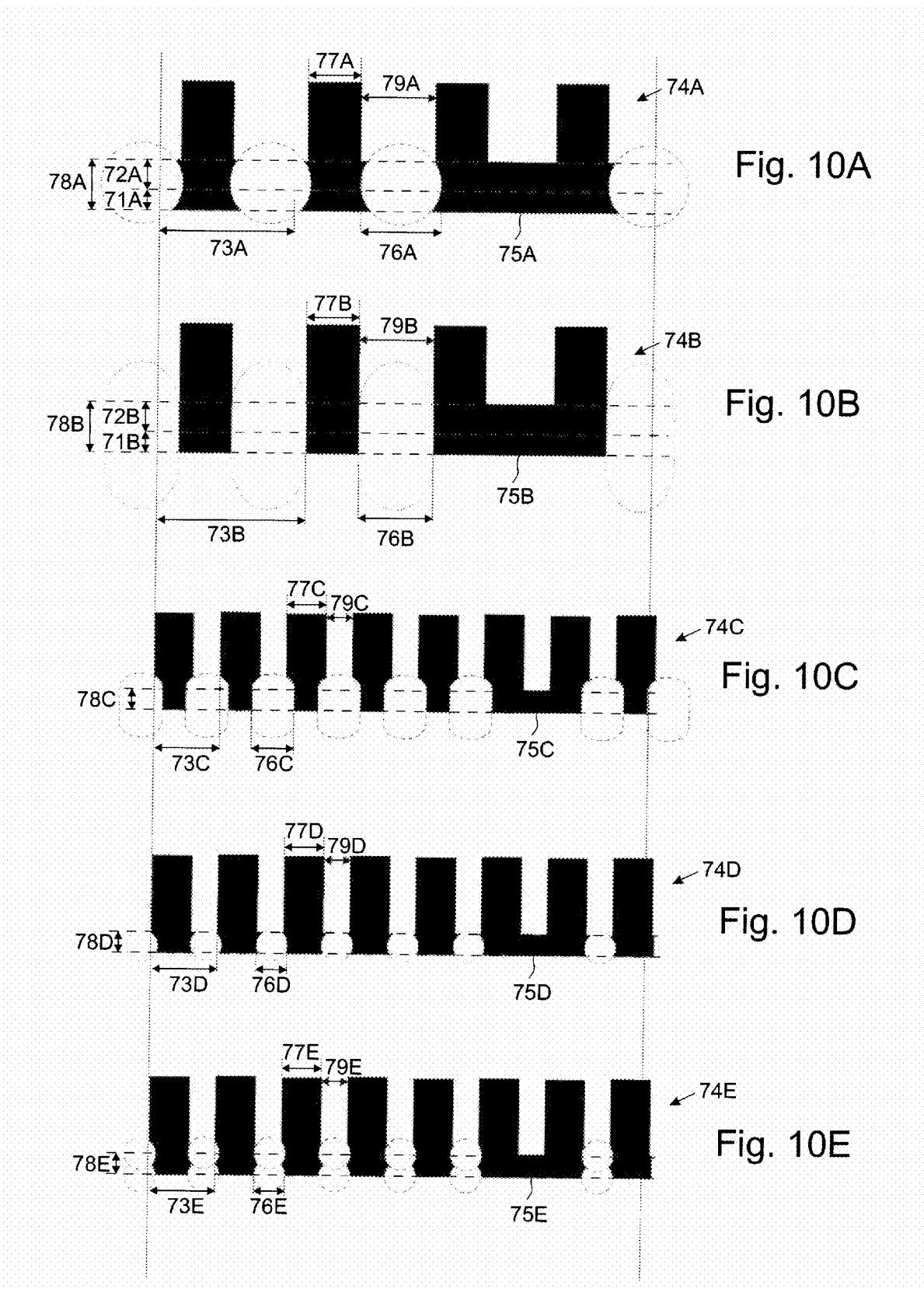
FIG. 10A presents an example of laser drilling finished feed through conductors according to the third embodiment of the invention.
FIG. 10B presents an example of laser routing finished feed through conductors according to the third embodiment of the invention.
FIG. 10C presents another example of laser routing finished feed through conductors according to the third embodiment of the invention.
FIG. 10D presents another example of laser drilling finished feed through conductors according to the third embodiment of the invention.
FIG. 10E presents yet another example of laser drilling finished feed through conductors according to the third embodiment of the invention.

FIG. 10A presents an example of laser drilling finished feed through conductors according to the third embodiment of the invention. As an example, a typical laser drilling is done in the middle of the conductors running on top or bottom surface part of the dielectric to make an opening in a vertical conductor part 71. FIG. 10B presents an example of laser routing of feed through conductors according to the third embodiment of the invention. FIG. 10C presents an example of an advanced laser routing of feed through conductors according to the third embodiment of the invention. FIG. 10D presents an example of an advanced laser drilling finished feed through conductors according to the third embodiment of the invention. FIG. 10E presents another example of an advanced laser drilling (two drilling punches) finished feed through conductors according to the third embodiment of the invention. In the current laser drilling means a typical value for a line width 67 is approximately 50 μm and for a space is approximately 75 μm. In advanced embodiments the respective values are 40 μm and 30 μm, for instance. The pitch 63 for typical embodiments is approximately 125 μm and advanced embodiments 70 μm.

Figure 11:
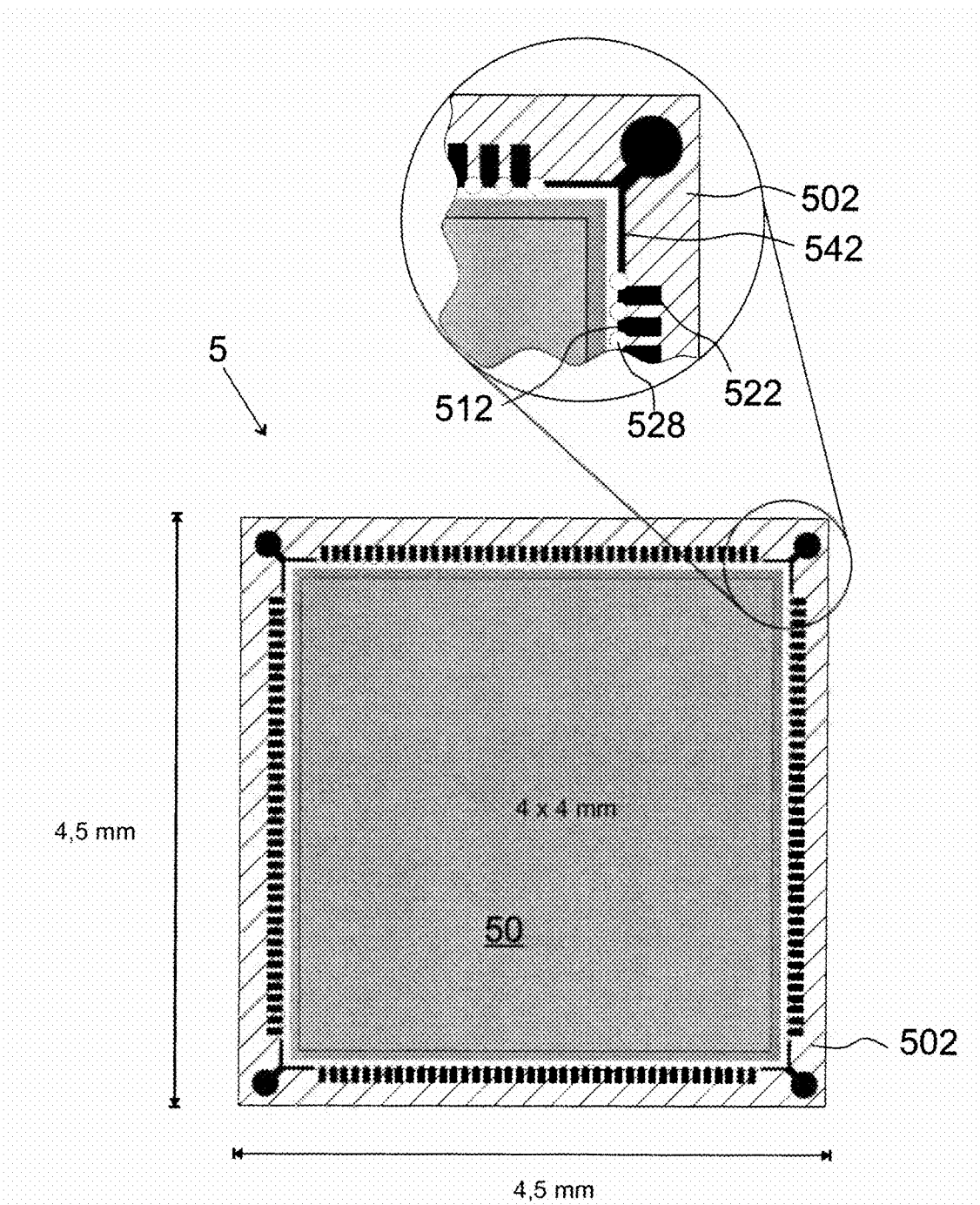
FIG. 11 presents an electronic module according to an embodiment of the invention manufactured by the third method.

FIG. 11 presents an electronic module 5 according to an embodiment of the invention manufactured by the third method. In the FIG. 11 there can be found a dielectric of a feed through conductor component 502, a vertical conductor 512, a conductor 522 running on the dielectric 502, an opening 528 and a combined conductor 542, can be used in different purposes such as interconnect routing, EMI shield or ground for example.

The series of illustrations shown in FIG. 12 show one possible process according to the invention. In the following, the process of FIG. 12 is examined in stages:

Stage A (FIG. 12A):
In stage A, a suitable baseboard 1001 is selected for the circuit-board manufacturing process. The baseboard 1001 can be, for example, a glass-fibre reinforced epoxy board, such as an FR4-type board. In the example process, the baseboard 1001 can thus be an organic board, as the example process does not require high temperatures. A flexible and cheap organic board can thus be selected for the baseboard 1001. Typically a board that is already coated with a conductive material 1002, usually copper, is selected for the baseboard 1001. Of course, an inorganic board can also be used.

Stage B (FIG. 12B):
In stage B, through holes 1003 are made in the baseboard for electrical contacts. The holes 1003 can be made, for example, with some known method used in circuit-board manufacture, such as mechanical drilling.

Stage C (FIG. 12C):
In stage C, metal is grown into the through holes made in stage B. In the example process, the metal 1004 is also grown on top of the circuit board, thus also increasing the thickness of the conductive layer 1002.

The conductive material 1004 to be grown is copper, or some other material with sufficient electrical conductivity. Copper metallizing can take place by coating the holes with a thin layer of chemical copper and then continuing the coating using an electrochemical copper-growing method. Chemical copper is used in the example, as it will also surface on top of a polymer and act as an electrical conductor in electrochemical coating. The metal can thus be grown using a wet-chemical method, so that the growth is cheap. Alternatively, the conductive layer 1004 can be made, for example, by filling the through holes with an electrically conductive paste.

Stage D (FIG. 12D):
In stage D, the conductive layer on the surface of the circuit board is patterned. This can be done by utilizing generally known circuit-board manufacturing methods. The patterning of the conductive layer is aligned, for example, on the holes made in stage B.

The manufacture of the conductor pattern can take place, for example, by laminating, on the surface of the metal 1004, a photolithographic polymer film, on which the desired conductive pattern is formed by directing light through a patterned mask. After exposure, the polymer film is developed, when the desired areas are removed from it and the copper 1004 under the polymer is revealed. Next, the copper revealed under the film is etched away, leaving the desired conductive pattern. The polymer acts as a so-called etching mask and openings 1005, at the foot of which the baseboard of the circuit board is revealed, are formed in the metal layer 1004. After this, the polymer film is also removed from on top of the copper 1004.

Stage E (FIG. 12E):
In stage E, holes 1006 are made in the baseboard for the microcircuits. The holes extend through the entire baseboard, from the first surface 1001a to the second surface 1001b. The holes may be made, for example, mechanically milling by means of a milling machine. The holes 1006 can also be made, for example, by stamping. The holes 1006 are aligned relative to the conductive patterns 1004 of the circuit board. The holes 1003 made during stage B can also be used to aid alignment, but then too the alignment is relative to the conductive patterns 1004, as the conductive patterns 1004 have a specific position in relation to the holes 1003.

Stage F (FIG. 12F):
In stage F, a polymer film 1007 forming an electrical insulation is made on the second surface 1001b of the baseboard and over the holes 1006. The polymer film 1007 is made in such a way that it is sufficiently rigid to retain the main features of its shape, but, however, not hardened, so that components can be attached by pressing them into the film. The polymer film should also be sufficiently rigid to be able to hold the components pressed into the film essentially immovable in relation to the base, during the following process stages.

The polymer film made in Stage F can be, for example, a pre-preg-type film.

If desired, a metal coating 1008 can also be made on top of the polymer film 1007 in stage F.

In the example process, stage F is carried out by laminating a thin polymer film (e.g., c. 40 μm) on the surface of the circuit board, on top of which is a layer of copper (e.g., c. 5 μm). Lamination takes place with the aid of pressure and heat. In the example process, the film is thus an RCC (Resin Coated Copper) foil. The lamination must then be carried out to be uncompleted, so that the polymer is not completely hardened. This is achieved by setting the laminating temperature sufficiently low and/or by shortening the duration of the heat treatment.

Stage G (FIG. 12G):

In stage G, the microcircuits 18 are assembled in the holes 1006, from the side of the first surface 1001a of the baseboard. Assembly can take place using a precision assembly machine, the microcircuits 18 being aligned relative to the conductive patterns of the circuit board. As in stage E, the holes made in stage B can be used to aid alignment.

The microcircuits 18 are assembled in such a way that they adhere to polymer film 1007 in the 'bottoms' of the holes 1006. The most suitable way to carry out assembly is to use such a force that the microcircuits 18 push slightly inside the polymer film 1007, so that the microcircuits are made to remain in place better. It is also advantageous to the process, if the microcircuits being assembled have contact protrusions 1009, which penetrate inside the polymer film 1007.

Figure 14:
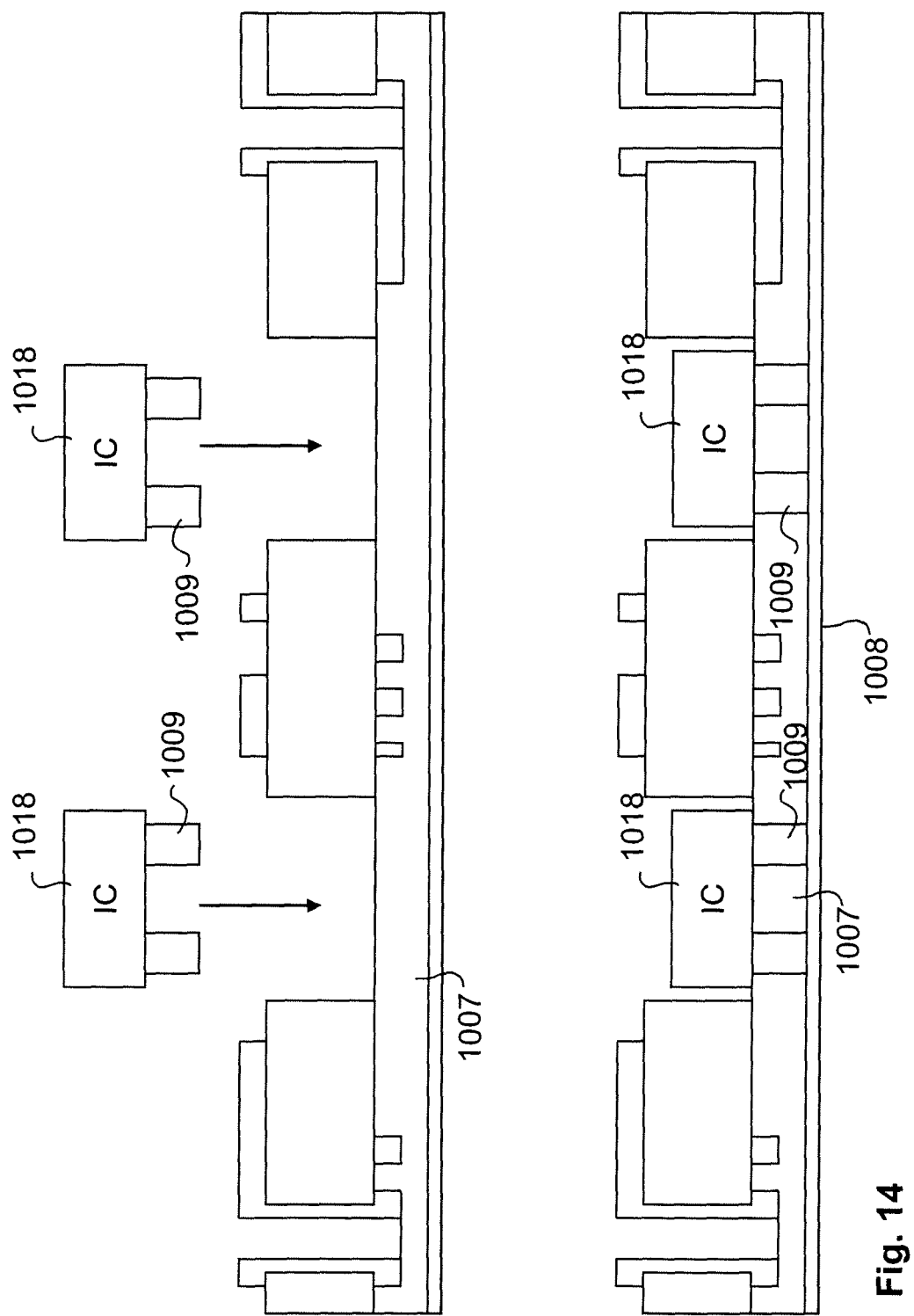
FIG. 14 shows a schematic diagram of one possible contact-forming method.

FIG. 14 shows an interesting alternative embodiment, in which the contact protrusions 1009 of the microcircuits 1018 are so long that they extend right through the polymer film 1007 to the metal coating 1008. In that case, there is no need to make holes in the polymer film 1007 (Stage K) for making contacts in the microcircuits, as the holes are formed in connection with the assembly of the components. In addition, the metallizing stage (Stage L) of the holes can be simplified, as the contact protrusions 1009 automatically form conductor columns through the polymer film 1007. In the embodiment of FIG. 14, the contact protrusions can also be given a sharp shape, so that their penetration ability improves. If the contact protrusions 1009 are sufficiently long and sharp, they can also penetrate the metal coating 1008 and in principle form an electrical contact between the microcircuit 18 and the metal coating 1008.

Stage H (not Shown):

In stage H, the polymer film 1007 is hardened with the aid of curing. Curing generally comprises a heat treatment, but the process can also employ some treatment other than heat to harden the polymer. If desired, stage H can also be omitted, particularly in connection with polymers cured by heat treatment. However, hardening the polymer at this stage prevents the microcircuit from moving relative to the base during stage I.

Stage I (FIG. 12I):

In stage I, the microcircuits are secured to the baseboard of the circuit board by filling the holes made for the microcircuits with a filler material 1010. In the example process, this stage is carried out by spreading casting epoxy into the holes from the first surface (1001a) of the circuit board and on top of the microcircuits. The epoxy is smoothed with a spatula and hardened by curing in an autoclave. At the same time, the polymer film 1007 is also hardened, if the process does not include stage H.

Stage J (FIG. 12J):

In stage J, a polymer film 1011 is formed on the first surface (1001a) of the circuit board, followed by a thin metal coating 1012 on top of the polymer film.

In the example process, stage J is carried out by laminating a thin polymer film (e.g., c. 40 μm) on the surface of the circuit board, on top of which is a layer of copper (e.g., c. 5 μm). Lamination takes place with the aid of pressure and heat. In the example process, the film is thus an RCC (Resin Coated Copper) foil.

The polymer film can also be made by, for example, spreading polymer in a liquid form on the circuit board. Thus lamination is not essential in stage J. What is essential is that an insulating layer, typically a polymer film, is made on the circuit board, which contains the embedded components, particularly embedded microcircuits. The polymer film itself can be, according to the embodiment, a filled or unfilled polymer film. The polymer film can also be coated with metal, but this is not essential, as the conductive surface can also be made later, on top of a polymer layer that is already attached to the circuit board.

Stage J makes it possible to use conventional manufacturing methods and work stages used in circuit board manufacture in the example process and nevertheless to be able to bury microcircuits and other components inside the circuit board.

Figure 12A:
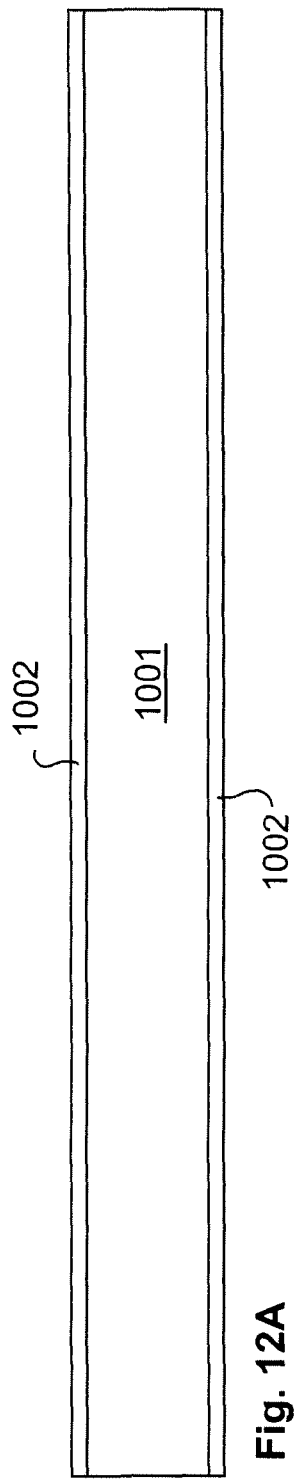
FIG. 12 shows a series of cross-sections of one process according to the invention.
Figure 12B:
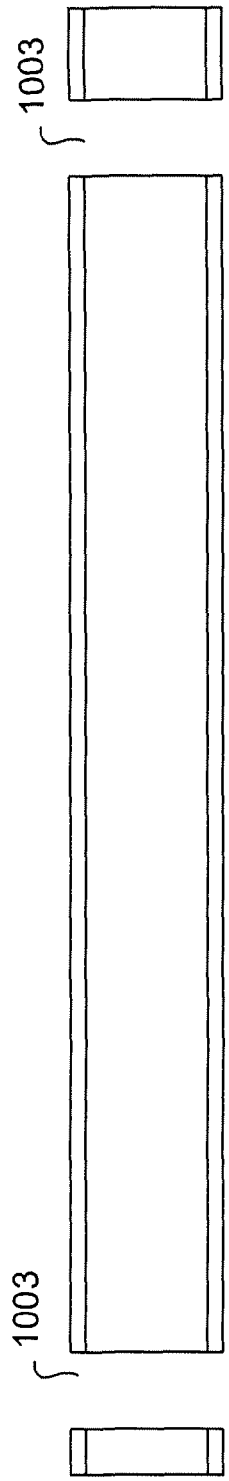
Figure 12C:
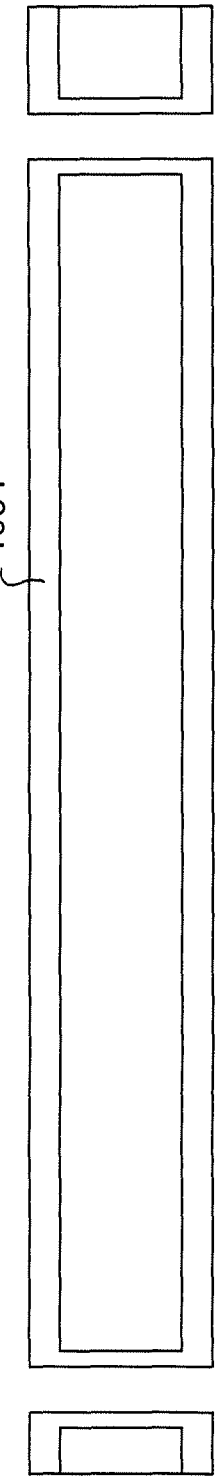
Figure 12G:
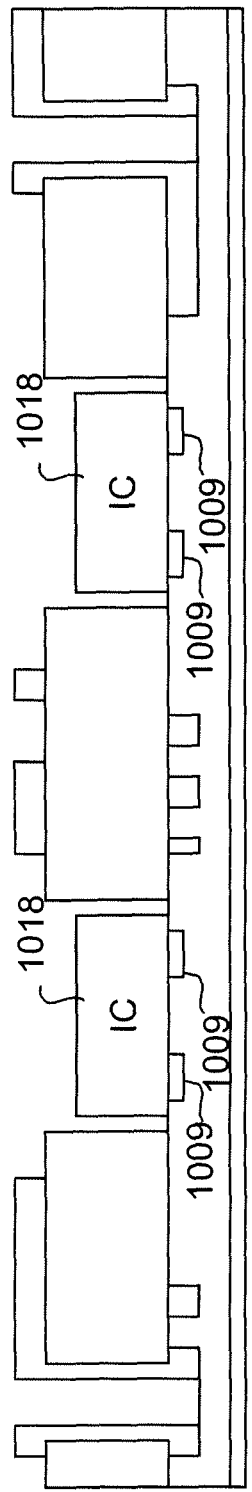
Figure 12I:
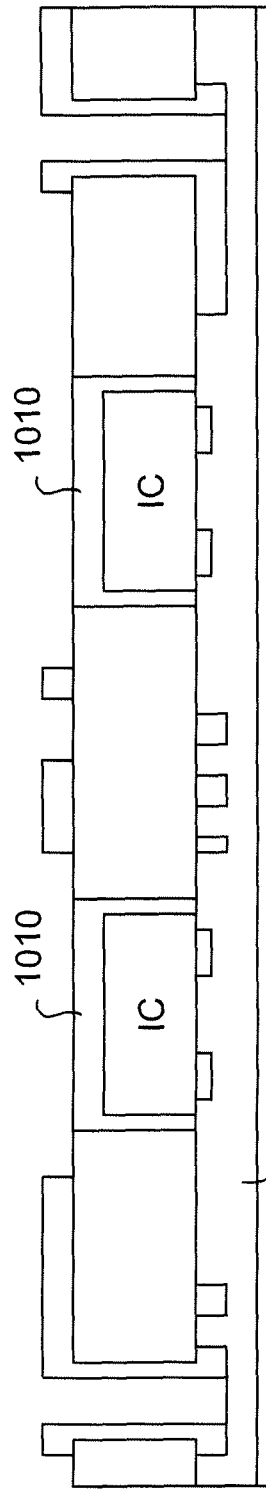
Figure 12J:
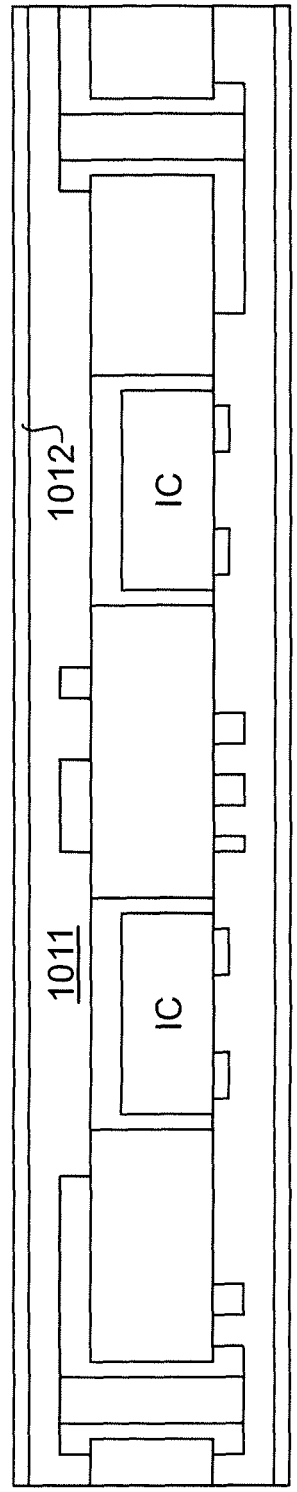
Figure 12K:
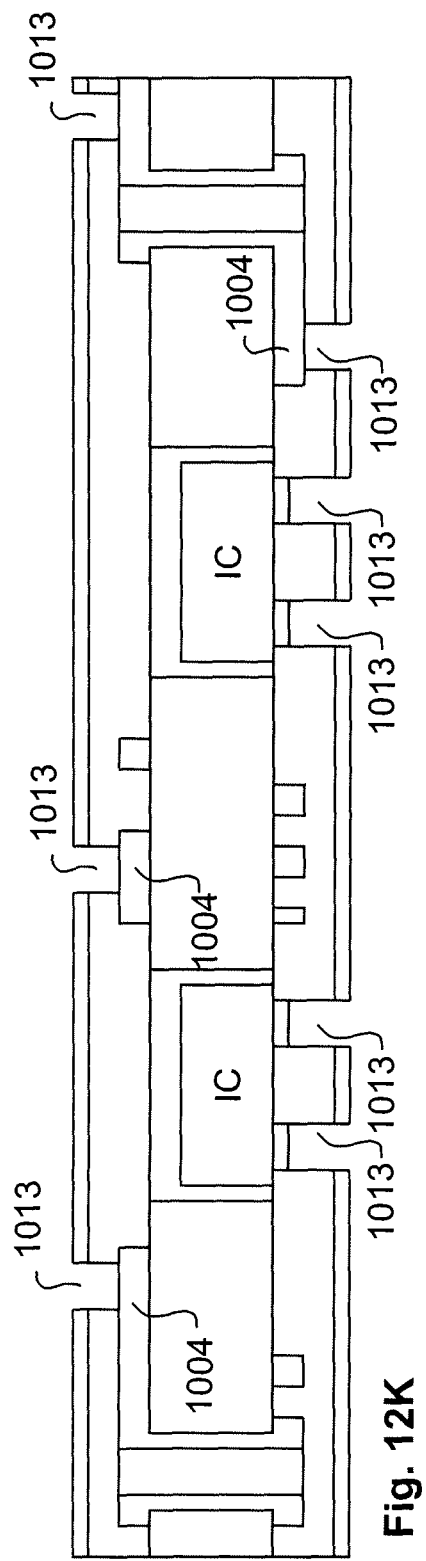
Figure 12L:
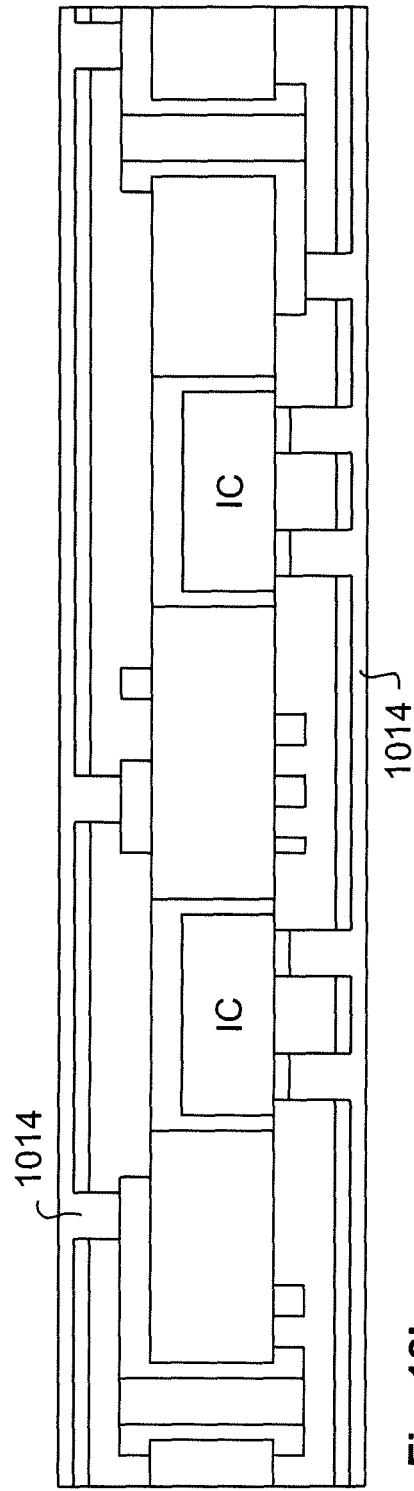
Figure 12M:
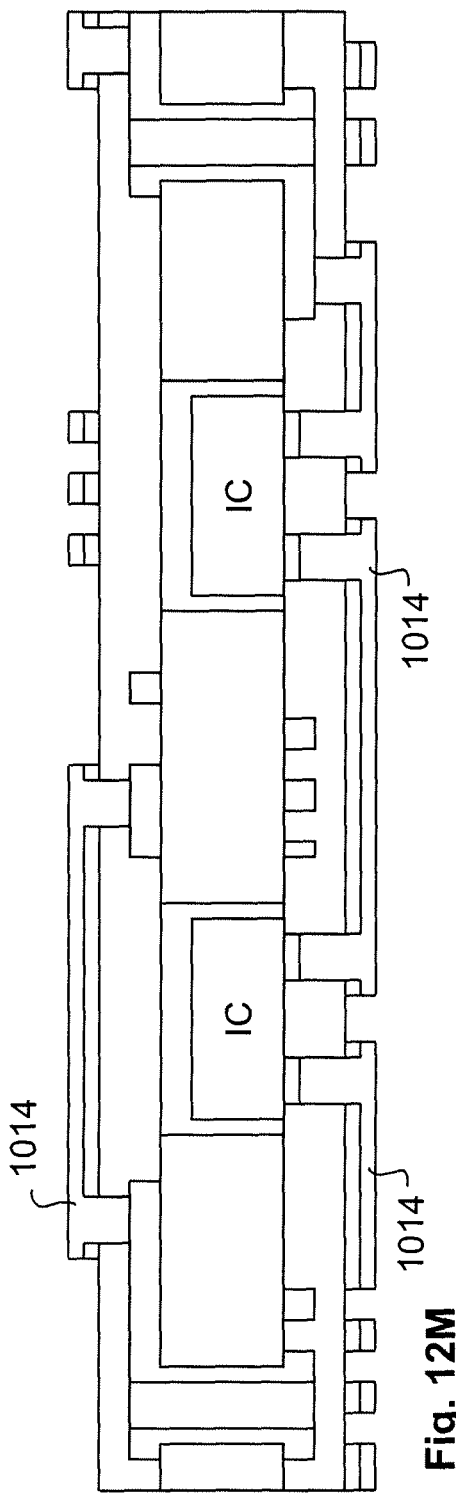
Figure 12N:
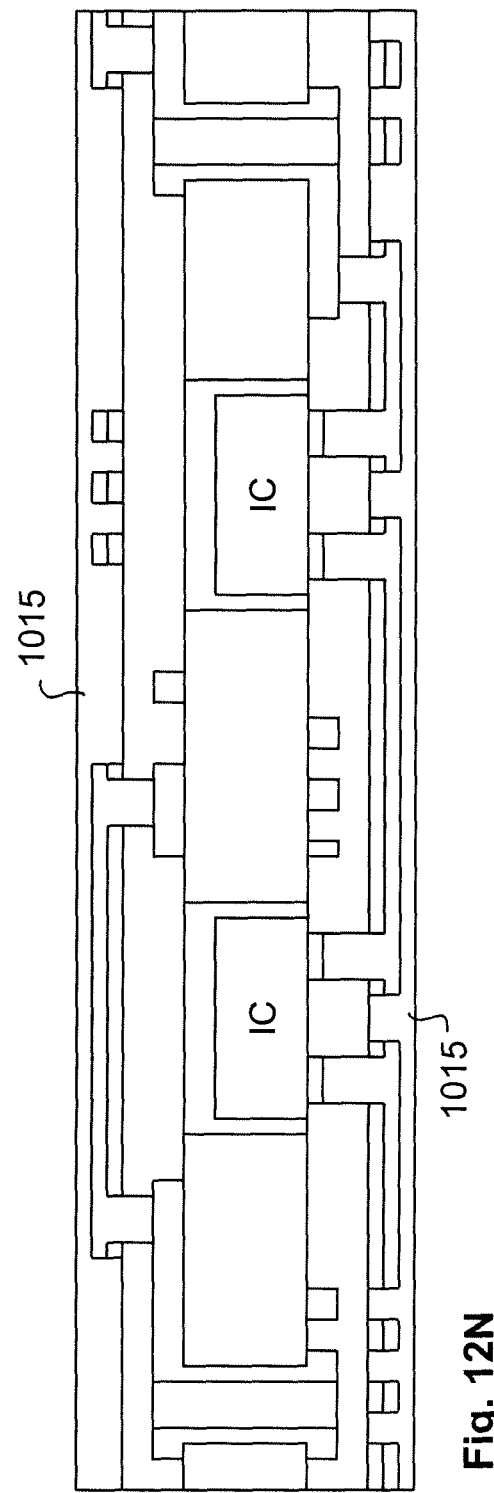
Figure 12O:
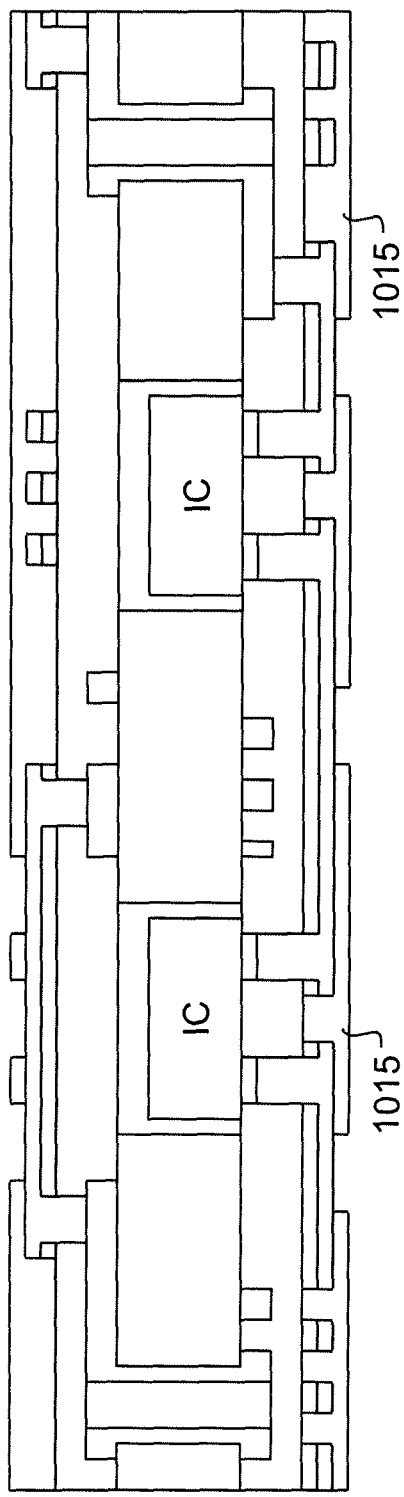
Figure 12P:
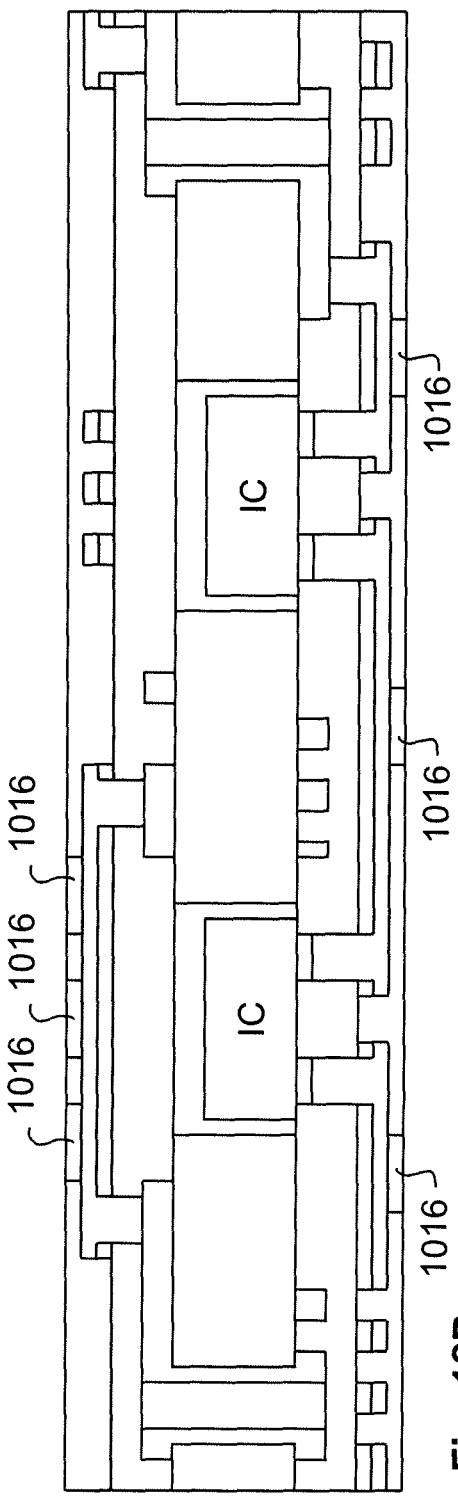

Stage K (FIG. 12K)

In stage K, holes 1013 are made in the polymer films 1007 and 1011 (and at the same time in the conductive foils 1008 and 1012), through which it is possible to create contacts with the conductive patterns and feed-throughs (conductive material 1004) of the circuit board and with the microcircuits.

The holes 1013 can be made, for example, using a laser, or some other suitable method. The conductive patterns made in stage D, or the through holes made in stage B can be used for alignment.

Stage L (FIG. 12L):

Stage L corresponds to stage C. In stage L, a conductive layer 1014 is made in the holes 1013 and on the surfaces of the circuit board.

In the example process, the feed-throughs (holes 1013) are first of all cleaned using a three-stage desmear treatment. After this, the feed-throughs are metallized by first forming a catalysing SnPd surface on the polymer and after that depositing a thin layer (about 2 Fm VAI 2 micrometers??) of chemical copper onto the surface. The thickness of the copper 1014 is increased by electrochemical deposition.

Alternatively, the feed-throughs can be filled with an electrically conductive paste or made using some other suitable micro-via metallizing method.

Stage M (FIG. 12M):

In stage M, a conductive pattern is formed in the same way as in stage D.

Stages N and O (FIGS. 12N and 12O):

In stages N and O, a photolithographic polymer 1015 is spread on the surface of the circuit board and the desired pattern is formed in the polymer 1015 (in a manner similar to that in stages D and M). The exposed polymer film is developed, but the polymer film pattern remaining on the circuit board is not removed.

Stage P (FIG. 12P):

In stage P, the connection areas of the polymer film pattern formed in the previous stage are coated 1016. The coating 1016 can be made with, for example, a Ni/Au coating, or an OSP (organic surface protection).

The example of FIG. 12 depicts one process, which can be used to exploit our invention. Our invention is thus in no way restricted to the process described above, but instead the invention covers a large group of different process and their end products, to the full extent of the Claims and allowing for equivalency interpretations. In particular, the invention is in no way restricted to the layout shown in the example, instead it will be obvious to one versed in the art that the processes according to our invention can be used to manufacture many kinds of circuit boards, which differ greatly from the examples disclosed here. Thus, the microcircuits and connections of the figures are only shown to illustrate the manufacturing process.

A great many changes can thus be made to the process of the example disclosed above, without nevertheless deviating from the idea according to the invention. The changes can relate to the manufacturing techniques depicted in the various stages, or, for example, to the mutual sequence of the stages. For example, stage B can equally well be carried out after stage D, i.e. the procedure can be to align the drill on the pattern, instead of aligning the pattern on the drilled holes. Correspondingly, the order of stages D and E can also be reversed. The component holes 1006 are then made before the conductive patterns are formed. In that case, the conductive pattern is aligned relative to the holes 1006 (and also the holes 1003). Irrespective of the order in which stages B, D, and E are carried out, the polymer film 1007 to be made in stage F covers the holes 1006 and the conductive pattern formed on the second surface 1001*b* of the baseboard.

Stages that are felt to be required can also be added to the process of the example disclosed above. For example, a foil that protects the surface of the circuit board during the casting taking place in stage H can be laminated onto the first side (1001*a*) of the circuit board. Such a protective foil is manufactured so that it covers all the other areas except for the holes 1006. The protective foil keeps the surface of the circuit board clean when the casting epoxy is spread with the spatula. The protective foil can be made in a suitable stage before stage I and removed from the surface of the circuit board immediately after the casting.

With the aid of the method, it is also possible to manufacture component packets to be attached to the circuit board. Such packets can also include several semiconductor components, which are connected electrically to each other.

The method can also be used to manufacture entire electrical modules. The process shown in FIG. 12 can also be applied in such a way that the conductive structure is made only on the second side (1001*b*) of the circuit board, to which the contact surfaces of the microcircuit are oriented.

The method makes it possible to manufacture, for example, circuit boards or electrical modules, in which the thickness of the baseboard used is in the range 50-200 microns and the thickness of the microcircuit and microcircuits is in the range 50-150 microns. The pitch of the conductors can vary, for example, in the range 50-250 microns while the diameter of the micro-feed-throughs can be, for example, 15-50 microns. Thus, the total thickness of a single board in a one-layer construction will be about 100-300 microns.

The invention can also be applied in such a way that circuit boards are assembled on top of each other, thus forming a multi-layer circuit structure, in which there are several circuit boards manufactured according to FIG. 12 set on top of each other and connected electrically to each other. The circuit boards set on top of each other can also be circuit boards in which the conductive structure is formed only on the second side 1001*b* of the circuit board, but which nevertheless include feed throughs, through which an electrical contact can also be formed to the microcircuits from the first side of the circuit board. FIG. 13 shows one such process.

Figure 13A:
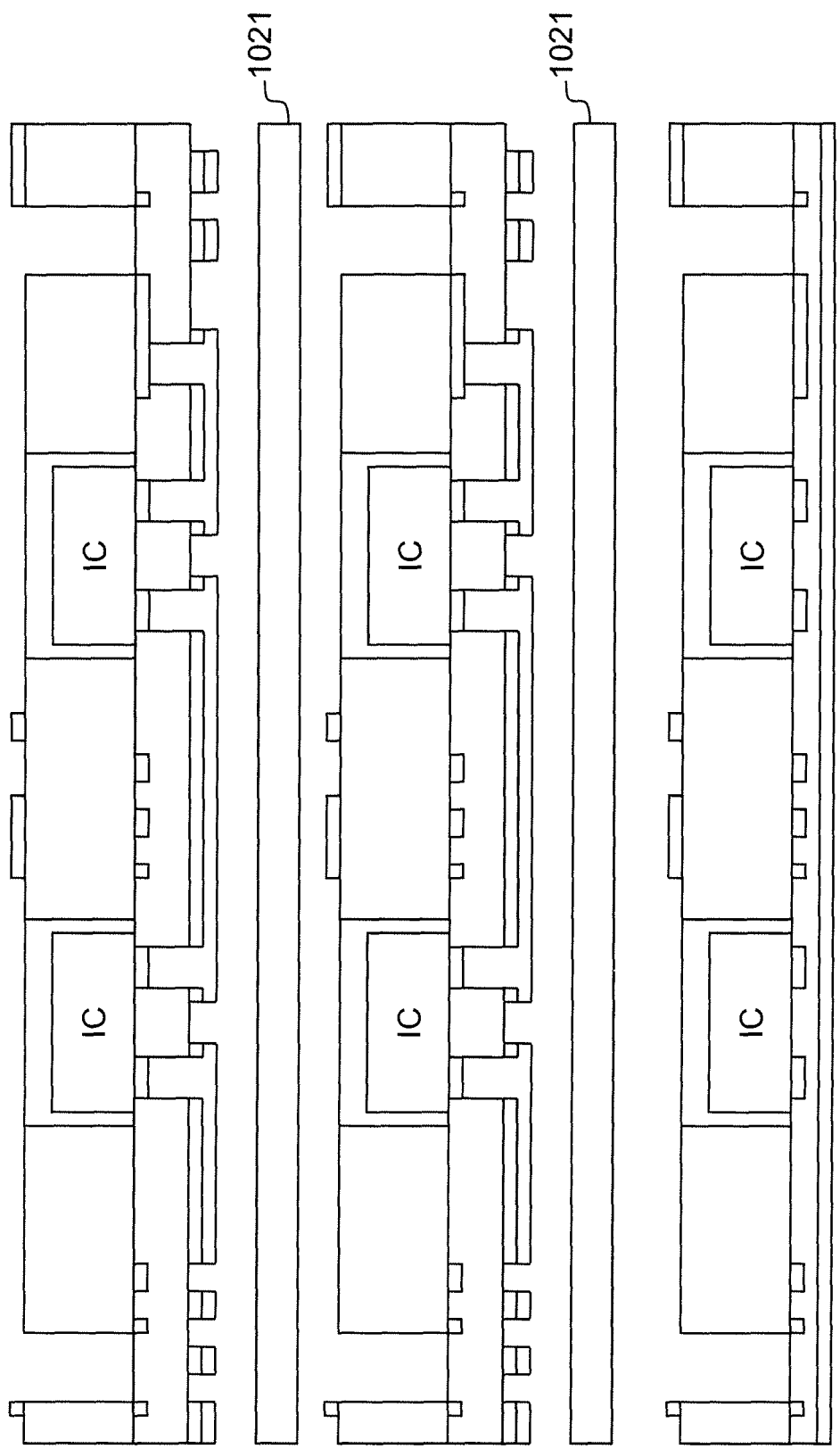
FIG. 13 shows a series of cross-sections of a second process according to the invention.
Figure 13B:
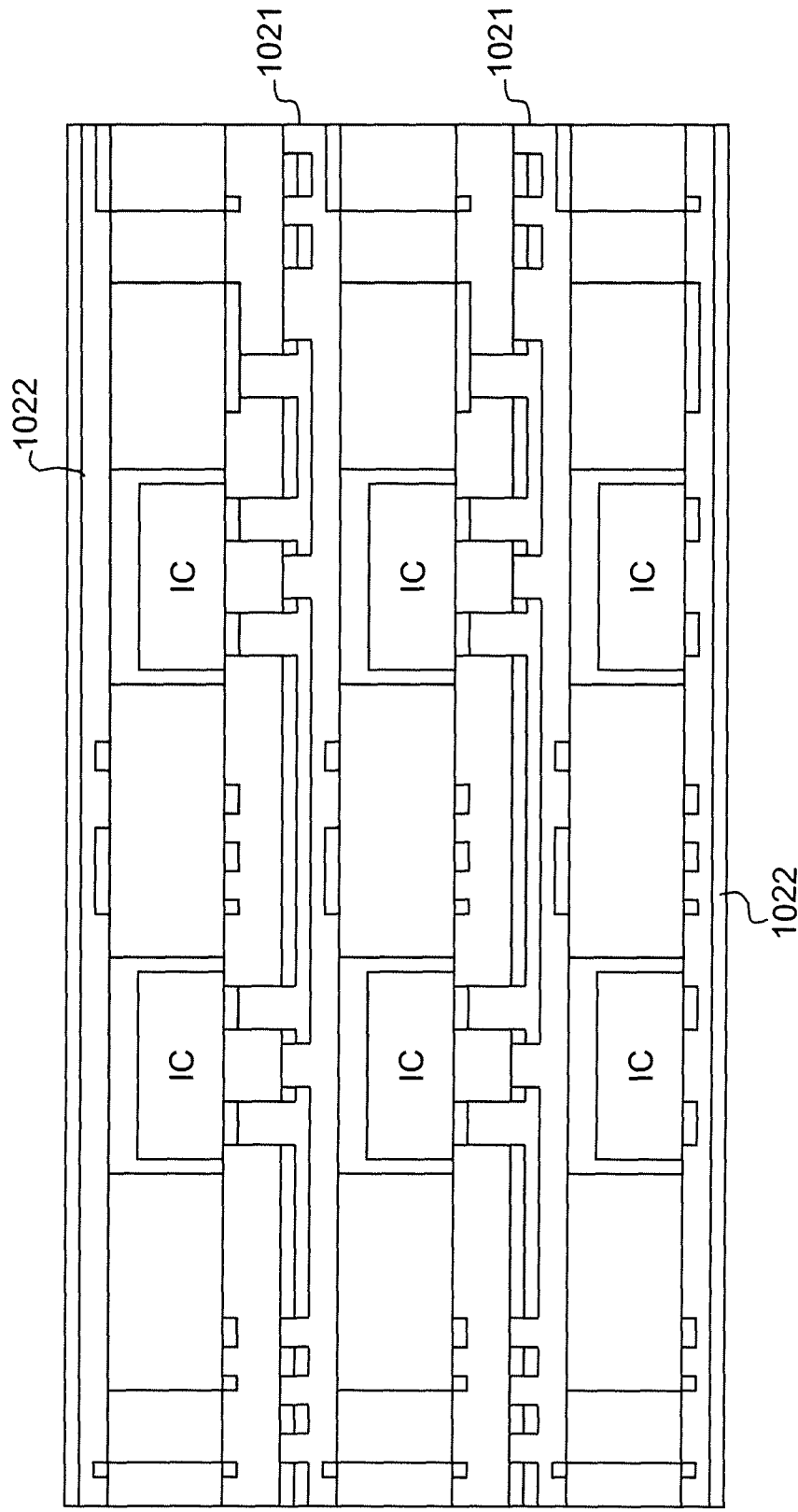
Figure 13C:
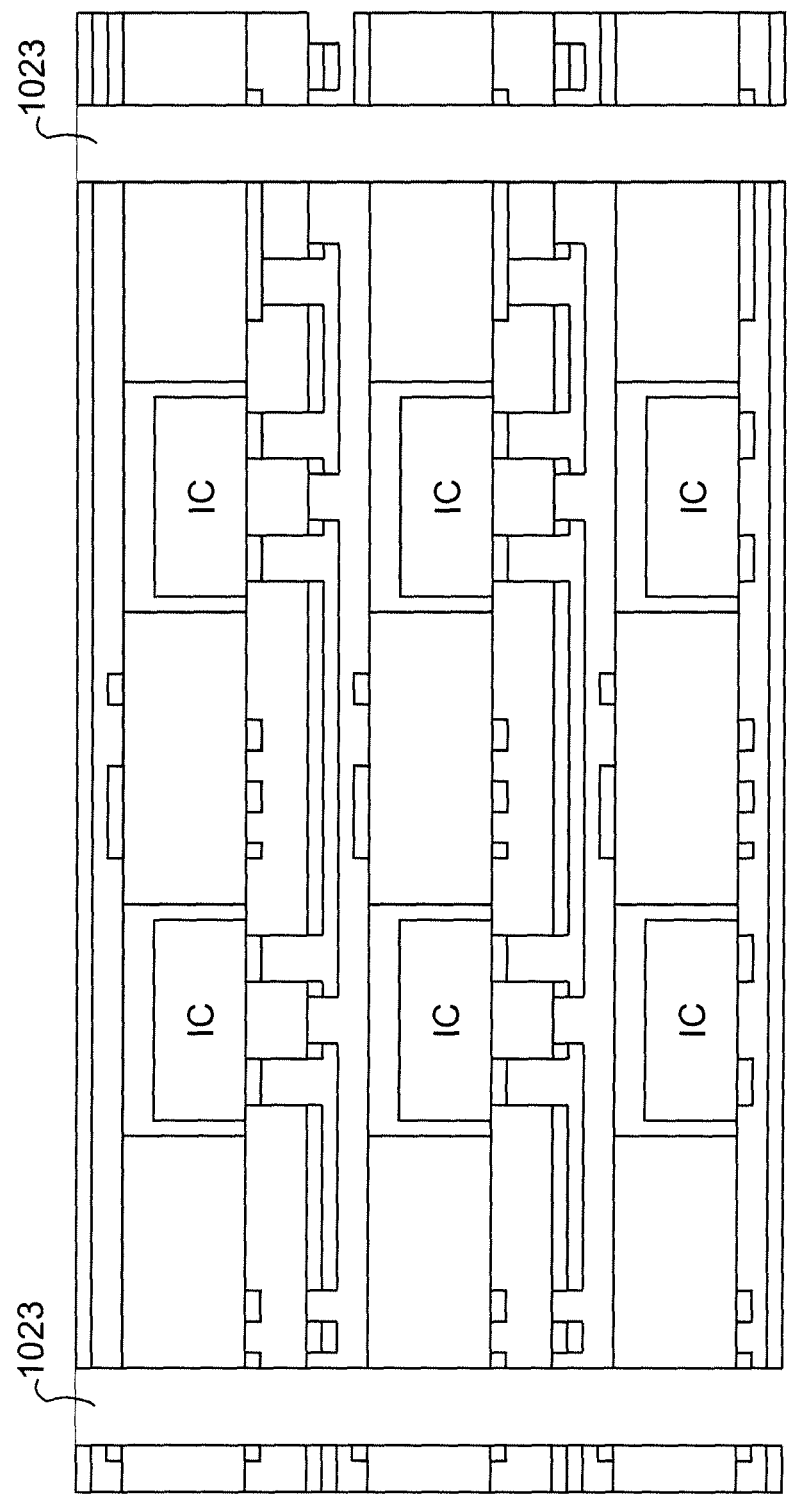

FIG. 13 shows the connection of circuit boards to each other. In the following, the process is described in stages.
Stage 2A (FIG. 13A):
Stage 2A depicts the circuit boards being set on top of each other. The lowest circuit board can be obtained, for example, after stage J of a modified process of FIG. 12. In this case, the process of FIG. 12 is then modified by omitting stage 1C.

The middle and upper circuit boards in turn can be obtained after stage M of a modified process of FIG. 12, for instance. In this case, the process of FIG. 12 is modified by omitting stage 1C and performing stages J, K, and L on only the second side (1001*b*) of the circuit board.

In addition to the circuit boards, FIG. 13A also shows pre-preg epoxy layers 1021 placed between the circuit boards.
Stage 2B (FIG. 13B):
In stage 2B, the circuit boards are laminated together with the aid of pre-preg epoxy layers 1021. In addition, a metal-coated polymer film 1022 is made on the upper surface of the circuit board. The process corresponds to stage J of the process of FIG. 12. In the example process, a metal-coated polymer film 1022 is already on the under surface of the circuit board.
Stage 2C (FIG. 13C):
In stage 2C, holes 1023, for the formation of contacts, are drilled in the circuit board.

After Stage 2C, the process can be continued for example as follows:
Stage 2D:
In stage 2D, conductive material is grown on top of the circuit board and in the through holes 1023, in the same way as in stage 1C.
Stage 2E:
In stage 2E, the conductive layer on the surface of the circuit board is patterned in the same way as in stage 1D.
Stage 2F:
In stage 2F, a photolithographic polymer is spread on the surfaces of the circuit board and the desired pattern is formed in the polymer in the same way as in stages 1N and 1O. The exposed polymer film is developed, but the polymer film pattern remaining on the circuit board is not removed.
Stage 2G:
In stage 2G, the connection areas of the polymer film pattern formed in the previous stage are metallized in the same way as in stage 1P.

On the basis of the example of FIG. 13, it is obvious that the method can also be used to manufacture many kinds of three-dimensional circuit structures. For example, the method can be used in such a way that several memory circuits are placed on top of each other, thus forming a packet containing several memory circuits, in which the memory circuits are connected to each other to form an operational totality. Such a packet can be termed a three-dimensional multichip module. The chips in such modules can be selected freely and the contacts between the chips can be easily made according to the selected circuits.

Figure 15A:
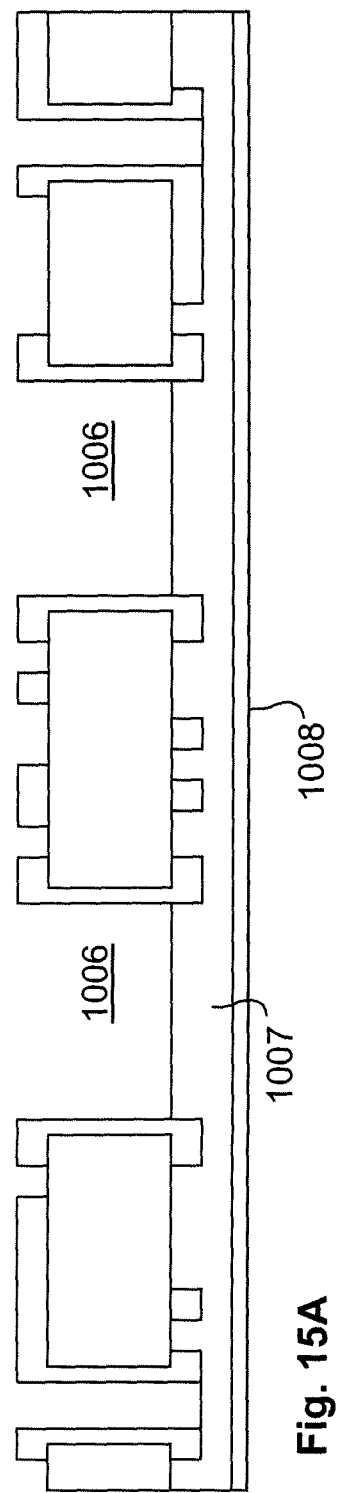
FIG. 15 shows a series of cross-sections of a third process according to the invention.

The invention also permits electromagnetic protection to be made around the component embedded in the base. This is because the method of FIG. 12 can be modified in such a way that the holes 1006 depicted in stage 1E can be made in connection with the making of the holes 1003 carried out in stage 1B. In that case, the conductive layer 1004 to be made in stage 1C will also cover the side walls of the holes 1006 made for the components. FIG. 15A shows a cross-section of the base structure as it is after stage 1F in the process modified in the aforesaid manner.

The process can be further modified such that after covering the side walls of the holes 1006 made for the components, which holes are also called installation cavities, the covering on the perimetrical side walls is divided into parallel portions e.g. by drilling. Then, the metallic structure shown in FIG. 15D around the semiconductor component (IC) can be divided into several feed through conductors connecting the layers 1004 on the first surface 1001*a* and the second surface 1001*b* of the dielectric substrate 1001. Thus, structures resembling those of FIGS. 5B to 7B can be made by the process.

Figure 15B:
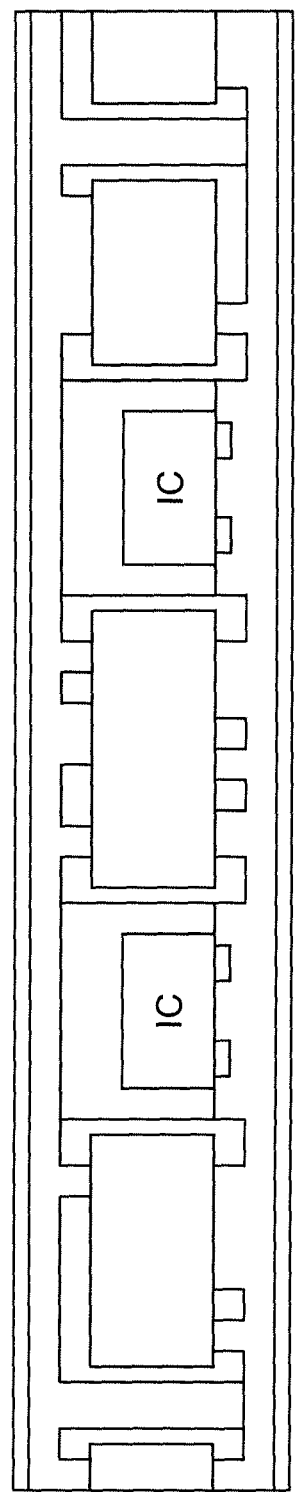

After the intermediate stage shown in FIG. 15A, the process can be continued by assembling the microcircuits in a similar way to stage 1G, the polymer film being hardened as in stage 1H, and the microcircuits being attached similarly to stage 1I. After this, polymer and metal foils can be formed on the first surface of the circuit board similarly to stage 1J. FIG. 15B shows an example cross-section of the base structure after these process stages.

Figure 15C:
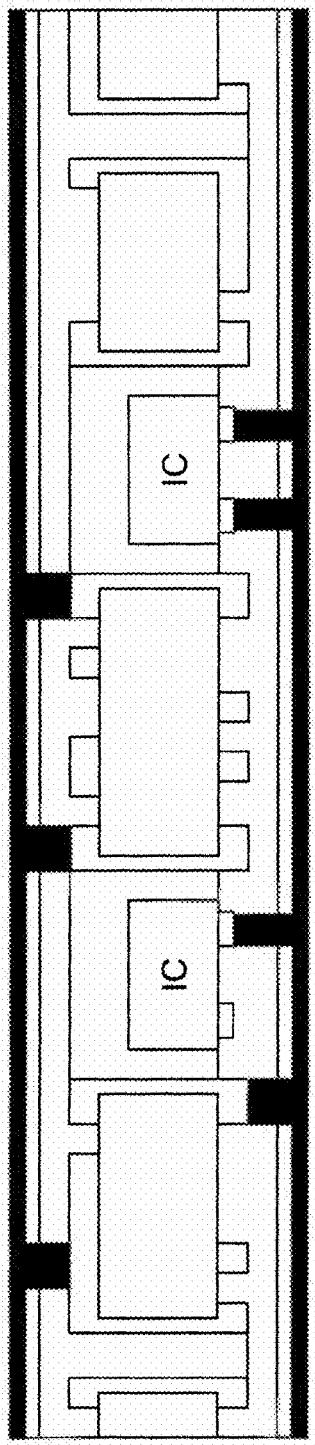

After the intermediate stage shown in FIG. 15B, the process can be continued by making holes, similar to those of stage 1K, in the polymer film, for making contacts. After this, a conductive layer is made in the holes and on the surfaces of the board similarly to stage 1L. FIG. 15C shows an example cross-section of the base structure after these process stages. For reasons of clarity, the conductive layer made similarly to stage 1L in the holes and on the board surfaces is highlighted in black.

Figure 15D:
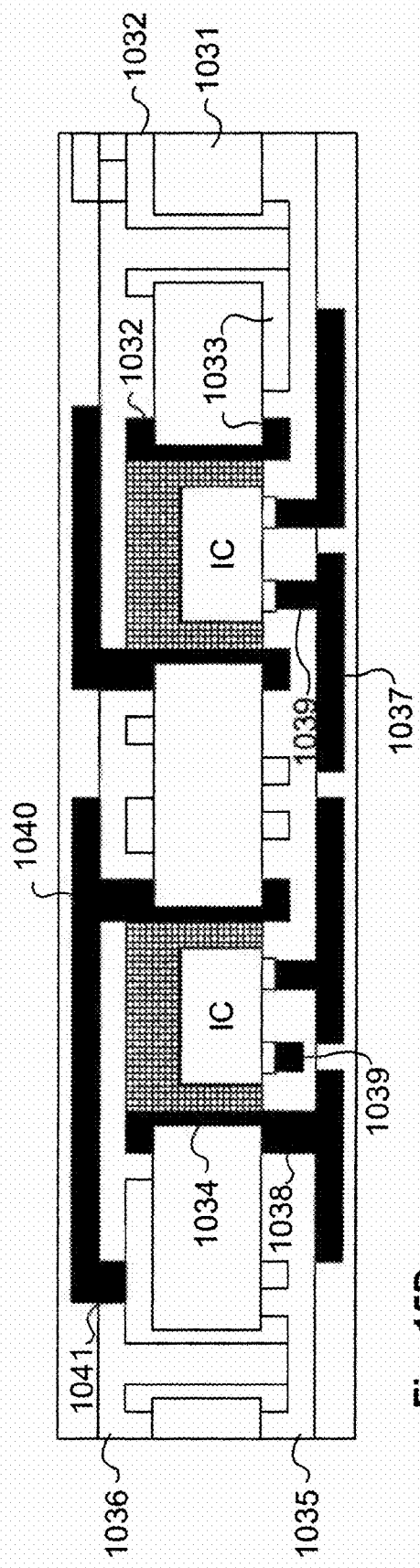

After the intermediate stage shown in FIG. 15C, the process can be continued by patterning a conductive layer on the surfaces of the board as in stage 1M and by coating the surfaces of the board as in stage 1N. After these stages, the microcircuits are surrounded by a nearly unbroken metal foil, which forms an effective protection against interference caused by electromagnetic interaction. This construction is shown in FIG. 15D. After the intermediate stage shown in FIG. 15D, stages corresponding to stages 1O and 1P are carried out, in which a protective foil and connections are made on the surface of the circuit board.

In FIG. 15D, the cross-sections of the metal layers protecting the microcircuits are highlighted in black. In addition, the background of the microcircuits is highlighted with cross-hatching. The cross-hatching is intended to be a reminder that all the sides of a hole made for a microcircuit are covered by a metal foil. Thus the microcircuit is surrounded laterally with an unbroken metal foil. In addition to this, a metal plate can be designed above the microcircuit, which is made in connection with the making of the circuit board's conductive pattern. Similarly, a metal foil that is as complete as possible is made below the microcircuit. The making of contacts below the microcircuit means that small gaps must be made in the metal foil, as shown in FIG. 15D, for instance. These gaps can, however, be made so narrow laterally, or, correspondingly, so thin vertically, that they do not weaken the protective effect obtained against electromagnetic interference.

When examining the example of FIG. 15D, it must also be take into account that the final structure also contains parts extending at right angles to the plane shown in the figure. Such a structure extending at right angles is shown by the conductor connected to the contact bump on the left-hand side of the left-hand microcircuit of FIG. 15D, which runs towards the viewer from between the metal foil surrounding the microcircuit laterally and the conductive layers below the microcircuit.

The solution shown by FIG. 15D thus provides the microcircuit with excellent protection against electromagnetic interference. As the protection is made immediately around the microcircuit, the construction also protects against mutual interference arising between the components contained in the circuit board. Most of the electromagnetic protective structure can also be earthed, as the metal foil surrounding the microcircuits laterally can be connected electrically to the metal plate above the circuit. The connections of the circuit board, can, in turn, be designed in such a way that the metal plate is earthed through the conductive structure of the circuit board.

The electronic module of FIG. 15D comprises a dielectric 1031 substrate having a first surface and a second surface and an installation cavity extending through the dielectric substrate and having a perimetrical side wall between the first surface and the second surface. The electronic module further comprises a first wiring layer 1032 on the first surface of the dielectric substrate, a second wiring layer 1033 on the second surface of the dielectric substrate, and a feed through conductor 1034 on the perimetrical side wall of the installation cavity and electrically connecting at least one conductor in the first wiring layer to at least one conductor in the second wiring layer. There is also at least one semiconductor component IC at least partially inside the installation cavity. The electronic module further comprises a first insulating layer 1035 on the second wiring layer, a second insulating layer 1036 on the first wiring layer, and a third wiring layer 1037 on the first insulating layer. The electronic module further comprises first microvias 1038 inside the first insulating layer and making electrical connections between the second wiring layer and the third wiring layer. The electronic module further comprises second microvias 1039 electrically connecting the at least one semiconductor component to at least one of the second wiring layer and the third wiring layer. According to FIG. 15D, the electronic module comprises also a fourth wiring layer 1040 on the second insulating layer and third microvias 1041 inside the second insulating layer and making electrical connections between the first wiring layer and the fourth wiring layer.

As has been described above, an embodiment of the invention concerns an electronic module, such as described in FIG. 5D or FIG. 15D, for instance, and comprising:

- a dielectric substrate 225, 1031 (reference numbers refer respectively FIG. 5D and FIG. 15D) having a first surface and a second surface;
- an installation cavity extending through the dielectric substrate 225, 1031 and having a perimetrical side wall between the first surface and the second surface;
- a first wiring layer 222, 1032 on the first surface of the dielectric substrate 225, 1031;
- a second wiring layer 232, 1033 on the second surface of the dielectric substrate 225, 1031;
- a feed through conductor 212, 1034 on the perimetrical side wall of the installation cavity and electrically connecting at least one conductor in the first wiring layer 222, 1032 to at least one conductor in the second wiring layer 232, 1033;
- at least one semiconductor component 30, IC at least partially inside the installation cavity;
- a first insulating layer . . . , 1035 on the second wiring layer 232, 1033;
- a second insulating layer . . . , 1036 on the first wiring layer 222, 1032;
- a third wiring layer 242, 1037 on the first insulating layer . . . , 1035;
- first microvias 252B, 1038 inside the first insulating layer . . . , 1035 and making electrical connections between the second wiring layer 232, 1033 and the third wiring layer 242, 1037;
- second microvias 253, 1039 electrically connecting the at least one semiconductor component 30, IC to at least one of the second wiring layer 232, 1033 and the third wiring layer 242, 1037;
- a fourth wiring layer 244, 1040 on the second insulating layer . . . , 1036; and third microvias 252A, 1041 inside the second insulating layer . . . , 1036 and making electrical connections between the first wiring layer 222, 1032 and the fourth wiring layer 244, 1040.

In a further embodiment, the at least one semiconductor component comprises at least two contact pads facing the second wiring layer; and at least some of the second microvias electrically connect at least some of the at least two contact pads to the second wiring layer.

In a further embodiment, the at least one semiconductor component comprises at least two contact pads facing the third wiring layer; and at least some of the second microvias electrically connect at least some of the at least two contact pads to the third wiring layer.

In a further embodiment, the electronic module further comprises an insulating material filling the installation cavity between the perimetrical side wall and the at least one semiconductor component.

In a further embodiment, at least one electrical path connects at least one conductor in the third wiring layer to at least one conductor in the fourth wiring layer, the at least one electrical path going through at least one first microvia, at least one conductor in the second wiring layer, at least one feed through conductor, at least one conductor in the first wiring layer and at least one third microvia.

In a further embodiment, the feed through conductors are electrically, solderlessly and metallurgically connected to the first wiring layer and the second wiring layer.

In a further embodiment, the fourth wiring layer defines a conducting plate at the location of the installation cavity and above the at least one semiconductor component.

In a further embodiment, the feed through conductor covers the whole perimetrical side wall of the installation cavity.

In a further embodiment:
the fourth wiring layer defines a conducting plate at the location of the installation cavity and above the at least one semiconductor component;
the feed through conductor covers the whole perimetrical side wall of the installation cavity; and
the conducting plate and the feed through conductor are connectable to a ground potential in order to form a shield against electromagnetic interference above and around the semiconductor component.

In a further embodiment, the feed through conductor is divided into portions such that a plurality of feed through conductors are formed on the perimetrical side wall of the installation cavity, the feed through conductors electrically connecting the first wiring layer and the second wiring to each other by a plurality of individual electrical routes.

Another embodiment concerns an electronic module comprising:
a dielectric substrate having a first surface opposite a second surface;
an installation cavity extending through the dielectric substrate and having a perimetrical side wall between the first surface and the second surface;
a first wiring layer on the first surface of the dielectric substrate;
a second wiring layer on the second surface of the dielectric substrate;
at least two feed through conductors on the perimetrical side wall of the installation cavity and electrically connecting the first wiring layer and the second wiring layer to each other by at least two individual electrical routes;
a first insulating layer on the second wiring layer;
a third wiring layer on the first insulating layer;
at least one semiconductor component at least partially inside the installation cavity and comprising at least two contact pads facing the third wiring layer;
first microvias inside the first insulating layer and making electrical connections between the second wiring layer and the third wiring layer;
second microvias electrically connecting at least some of the contact pads of the semiconductor component to the third wiring layer;
a second insulating layer on the first wiring layer;
a fourth wiring layer on the second insulating layer;
third microvias inside the fourth insulating layer and making electrical connections between the first wiring layer and the fourth wiring layer.

In a further embodiment, the further the electronic module comprises an insulating material filling the installation cavity between the perimetrical side wall and the at least one semiconductor component.

In a further embodiment, at least one electrical path connects at least one conductor in the third wiring layer to at least one conductor in the fourth wiring layer, the at least one electrical path going through at least one first microvia, at least one conductor in the second wiring layer, at least one feed through conductor, at least one conductor in the first wiring layer and at least one third microvia.

In a further embodiment, the feed through conductors are electrically, solderlessly and metallurgically connected to the first wiring layer and the second wiring layer.

In a further embodiment, wherein
the at least one semiconductor component comprises contact pads facing the third wiring layer;
the least two feed through conductors comprise a plurality of feed through conductors;
the second wiring layer comprises a plurality of first conductors defining contact areas and connecting said contact areas to at least some of the plurality of feed through conductors;
the third wiring layer comprises a plurality of second conductors extending from the location of at least some of the contact pads to the location of at least some of the contact areas;
the module further comprises first microvias electrically connecting at least some of the contact areas to at least some of the second conductors in the third wiring layer; and
the module further comprises a second microvias electrically connecting at least some of the contact pads to at least some of the second conductors in the third wiring layer.

In a further embodiment, the electronic module further comprises a layer of electrically insulating adhesive between the semiconductor component and the third wiring layer; and the second microvias electrically connecting the at least two contact pads to the third wiring layer being located inside the layer of electrically insulating adhesive.

In one embodiment, an electronic module comprises:
a dielectric substrate having a first surface opposite a second surface;
an installation cavity extending through the dielectric substrate and having a perimetrical side wall between the first surface and the second surface;
a first wiring layer on the first surface of the dielectric substrate;
a second wiring layer on the second surface of the dielectric substrate;
at least two feed through conductors on the perimetrical side wall of the installation cavity and electrically connecting the first wiring layer and the second wiring to each other by at least two individual electrical routes; and at least one semiconductor component at least partially inside the installation cavity.

In a further embodiment, the electronic module further comprises an insulating material filling the installation cavity between the perimetrical side wall and the at least one semiconductor component.

In a further embodiment, the electronic module further comprises a first insulating layer on the second wiring layer;
a third wiring layer on the first insulating layer; and
first microvias inside the first insulating layer and making electrical connections between the second wiring layer and the third wiring layer.

In a further embodiment, the at least one semiconductor component comprises at least two contact pads facing the third wiring layer; and the module further comprises second microvias electrically connecting the at least two contact pads to the third wiring layer.

In a further embodiment, the electronic module further comprises a second insulating layer on the first wiring layer;
a fourth wiring layer on the second insulating layer; and
third microvias inside the fourth insulating layer and making electrical connections between the first wiring layer and the fourth wiring layer.

In a further embodiment, at least one electrical path connects at least one conductor in the third wiring layer to at least one conductor in the fourth wiring layer, the at least one electrical path going through at least one first microvia, at least one conductor in the second wiring layer, at least one feed through conductor, at least one conductor in the first wiring layer and at least one third microvia.

In a further embodiment, the feed through conductors are electrically, solderlessly and metallurgically connected to the first wiring layer and the second wiring layer.

In a further embodiment, the at least two feed through conductors comprise a plurality of parallel feed through conductors each having a width and spacing from their neighboring feed through conductor such that the pitch in said plurality conductors is less than 300 micrometers, and wherein the pitch is defined as the sum of the width of the individual conductors and the spacing of the same individual conductors from their neighboring feed through conductor.

In a further embodiment, the pitch in said plurality conductors is less than 200 micrometers.

In a further embodiment, the pitch in said plurality conductors is less than 100 micrometers.

In a further embodiment:
the at least one semiconductor component comprises contact pads facing the third wiring layer;
the least two feed through conductors comprise a plurality of feed through conductors;
the second wiring layer comprises a plurality of first conductors defining contact areas and connecting said contact areas to at least some of the plurality of feed through conductors;
the third wiring layer comprises a plurality of second conductors extending from the location of at least some of the contact pads to the location of at least some of the contact areas;
the module further comprises first microvias electrically connecting at least some of the contact areas to at least some of the second conductors in the third wiring layer; and the module further comprises a second microvias electrically connecting at least some of the contact pads to at least some of the second conductors in the third wiring layer.

In a further embodiment, the electronic module further comprises a layer of electrically insulating adhesive between the at least one semiconductor component and the third wiring layer; and the second microvias electrically connecting the at least two contact pads to the third wiring layer being located inside the layer of electrically insulating adhesive.

In a further embodiment, each feed through conductor has a thickness of less than 20 micrometers from the perimetrical side wall of the installation cavity.

According to an even further embodiment, there is provided a semiconductor chip package comprising:
a dielectric substrate having a first surface opposite a second surface;
an installation cavity extending through the dielectric substrate between the first surface and the second surface, and having a side wall defining said cavity;
at least one semiconductor chip having contact pads inside the installation cavity;
a first wiring layer on the first surface of the dielectric substrate;
a second wiring layer on the second surface of the dielectric substrate;
feed through conductors on the side wall of the installation cavity and electrically connecting the first wiring layer and the second wiring;
a first insulating layer on the second wiring layer;
a third wiring layer on the first insulating layer;
first microvias inside the first insulating layer and making electrical connections between the second wiring layer and the third wiring layer; and
second microvias electrically connecting at least some of the contact pads of the semiconductor chip to the third wiring layer.

In a further embodiment, the semiconductor chip package comprises:
a second insulating layer on the first wiring layer;
a fourth wiring layer on the second insulating layer; and
third microvias inside the second insulating layer and making electrical connections between the first wiring layer and the fourth wiring layer.

In a further embodiment, a plurality of electrical paths connect at least some of the contact pads of the semiconductor chip to the first wiring layer on the first surface of the dielectric substrate.

In a further embodiment, said plurality of electrical paths go through at least one second microvia, at least one conductor in the third wiring layer, at least one first microvia, at least one conductor in the second wiring layer and at least one feed through conductor.

Also methods for manufacturing electronic modules are provides.

According to an embodiment, a method for manufacturing an electronic module comprises:
providing a dielectric substrate having a first surface and a second surface;
making an installation cavity extending through the dielectric substrate and having a perimetrical side wall between the first surface and the second surface;
making a first wiring layer on the first surface of the dielectric substrate;
making a second wiring layer on the second surface of the dielectric substrate;

making at least one feed through conductor on the perimetrical side wall of the installation cavity and electrically connecting at least one conductor in the first wiring layer to at least one conductor in the second wiring;

providing at least one semiconductor component at least partially inside the installation cavity;

making a first insulating layer on the second wiring layer;

making a second insulating layer on the first wiring layer;

making a third wiring layer on the first insulating layer;

making first microvias inside the first insulating layer and making electrical connections between the second wiring layer and the third wiring layer;

making second microvias electrically connecting the at least one semiconductor component to at least one of the second wiring layer and the third wiring layer;

making a fourth wiring layer on the second insulating layer; and making third microvias inside the second insulating layer and making electrical connections between the first wiring layer and the fourth wiring layer.

In a further embodiment of the method, the making of the at least one feed through conductor comprises plating copper on the perimetrical side wall of the installation cavity.

In a further embodiment of the method, the making of the at least one feed through conductor comprises covering all the perimetrical side wall of the installation cavity with metal.

In a further embodiment of the method, the making of the at least one feed through conductor comprises:

plating metal on the perimetrical side wall of the installation cavity, and dividing the metal into portions such that a plurality of feed through conductors are formed on the perimetrical side wall of the installation cavity, the feed through conductors electrically connecting the first wiring layer and the second wiring to each other by a plurality of individual electrical routes.

Another method for manufacturing an electronic module comprises:

providing a dielectric substrate having a first surface opposite a second surface;

making an installation cavity extending through the dielectric substrate and having a perimetrical side wall between the first surface and the second surface;

making a first wiring layer on the first surface of the dielectric substrate;

making a second wiring layer on the second surface of the dielectric substrate;

making at least two feed through conductors on the perimetrical side wall of the installation cavity and electrically connecting the first wiring layer and the second wiring to each other by means of the feed through conductors; and providing at least one semiconductor component at least partially inside the installation cavity.

A further method for manufacturing an electronic module comprises:

providing a dielectric substrate having a first surface opposite a second surface;

making at least two feed through holes extending from the first surface to the second surface in the dielectric substrate;

making a first wiring layer on the first surface of the dielectric substrate;

making a second wiring layer on the second surface of the dielectric substrate;

making at least two feed through conductors in the feed through holes, the feed through conductors electrically connecting the first wiring layer and the second wiring to each other;

making an installation cavity through the dielectric substrate by cutting a portion of the dielectric substrate and a portion of the feed through holes and feed through conductors, and wherein the installation cavity has a perimetrical side wall between the first surface and the second surface, the remaining portion of the cut feed through holes forms a portion of the perimetrical side wall and the remaining portion of the cut feed through conductors are located on the perimetrical side wall; and providing at least one semiconductor component at least partially inside the installation cavity.

The above description is only to exemplify the invention and is not intended to limit the scope of protection offered by the claims. The claims are also intended to cover the equivalents thereof and not to be construed literally.

The invention claimed is:

1. An electronic module comprising:
a dielectric substrate having a first surface and a second surface;
an installation cavity extending through the dielectric substrate and having a perimetrical side wall between the first surface and the second surface;
a first wiring layer on the first surface of the dielectric substrate;
a second wiring layer on the second surface of the dielectric substrate;
a feed through conductor on the perimetrical side wall of the installation cavity and electrically connecting at least one conductor in the first wiring layer to at least one conductor in the second wiring layer;
at least one semiconductor component at least partially inside the installation cavity;
a first insulating layer on the second wiring layer;
a second insulating layer on the first wiring layer;
a third wiring layer on the first insulating layer;
first microvias inside the first insulating layer and making electrical connections between the second wiring layer and the third wiring layer;
second microvias electrically connecting the at least one semiconductor component to at least one of the second wiring layer and the third wiring layer;
a fourth wiring layer on the second insulating layer; and
third microvias inside the second insulating layer and making electrical connections between the first wiring layer and the fourth wiring layer.

2. The electronic module of claim 1, wherein the at least one semiconductor component comprises at least two contact pads facing the second wiring layer; and at least some of the second microvias electrically connect at least some of the at least two contact pads to the second wiring layer.

3. The electronic module of claim 1, wherein the at least one semiconductor component comprises at least two contact pads facing the third wiring layer; and at least some of the second microvias electrically connect at least some of the at least two contact pads to the third wiring layer.

4. The electronic module of claim 1 further comprising an insulating material filling the installation cavity between the perimetrical side wall and the at least one semiconductor component.

5. The electronic module of claim 1, wherein at least one electrical path connects at least one conductor in the third wiring layer to at least one conductor in the fourth wiring layer, the at least one electrical path going through at least one first microvia, at least one conductor in the second wiring layer, at least one feed through conductor, at least one conductor in the first wiring layer and at least one third microvia.

6. The electronic module of claim 1, wherein the fourth wiring layer defines a conducting plate at the location of the installation cavity and above the at least one semiconductor component.

7. The electronic module of claim 1, wherein the feed through conductor covers the whole perimetrical side wall of the installation cavity.

8. The electronic module of claim 1, wherein
the fourth wiring layer defines a conducting plate at the location of the installation cavity and above the at least one semiconductor component;
the feed through conductor covers the whole perimetrical side wall of the installation cavity; and
the conducting plate and the feed through conductor are connectable to a ground potential in order to form a shield against electromagnetic interference above and around the semiconductor component.

9. The electronic module of claim 1, wherein the feed through conductor is divided into portions such that a plurality of feed through conductors are formed on the perimetrical side wall of the installation cavity, the feed through conductors electrically connecting the first wiring layer and the second wiring to each other by a plurality of individual electrical routes.

10. An electronic module comprising:
a dielectric substrate having a first surface opposite a second surface;
an installation cavity extending through the dielectric substrate and having a perimetrical side wall between the first surface and the second surface;
a first wiring layer on the first surface of the dielectric substrate;
a second wiring layer on the second surface of the dielectric substrate;
at least two feed through conductors on the perimetrical side wall of the installation cavity and electrically connecting the first wiring layer and the second wiring to each other by at least two individual electrical routes;
at least one semiconductor component at least partially inside the installation cavity,
an insulating material filling the installation cavity between the perimetrical side wall and the at least on semiconductor component;
a first insulating layer on the second wiring layer;
a third wiring layer on the first insulating layer; and
first microvias inside the first insulating layer and making electrical connections between the second wiring layer and the third wiring layer.

11. The electronic module of claim 10, wherein the at least one semiconductor component comprises at least two contact pads facing the third wiring layer; and the module further comprises
second microvias electrically connecting the at least two contact pads to the third wiring layer;
a second insulating layer on the first wiring layer;
a fourth wiring layer on the second insulating layer; and
third microvias inside the fourth insulating layer and making electrical connections between the first wiring layer and the fourth wiring layer.

12. The electronic module of claim 11, wherein at least one electrical path connects at least one conductor in the third wiring layer to at least one conductor in the fourth wiring layer, the at least one electrical path going through at least one first microvia, at least one conductor in the second wiring layer, at least one feed through conductor, at least one conductor in the first wiring layer and at least one third microvia.

13. The electronic module of claim 10, wherein
the at least one semiconductor component comprises contact pads facing the third wiring layer;
the least two feed through conductors comprise a plurality of feed through conductors;
the second wiring layer comprises a plurality of first conductors defining contact areas and connecting said contact areas to at least some of the plurality of feed through conductors;
the third wiring layer comprises a plurality of second conductors extending from the location of at least some of the contact pads to the location of at least some of the contact areas;
the module further comprises first microvias electrically connecting at least some of the contact areas to at least some of the second conductors in the third wiring layer; and
the module further comprises a second microvias electrically connecting at least some of the contact pads to at least some of the second conductors in the third wiring layer.

14. The electronic module of claim 11 further comprising a layer of electrically insulating adhesive between the at least one semiconductor component and the third wiring layer; and the second microvias electrically connecting the at least two contact pads to the third wiring layer being located inside the layer of electrically insulating adhesive.

15. A semiconductor chip package comprising:
a dielectric substrate having a first surface opposite a second surface;
an installation cavity extending through the dielectric substrate between the first surface and the second surface, and having a side wall defining said cavity;
at least one semiconductor chip having contact pads inside the installation cavity;
a first wiring layer on the first surface of the dielectric substrate;
a second wiring layer on the second surface of the dielectric substrate;
feed through conductors on the side wall of the installation cavity and electrically connecting the first wiring layer and the second wiring;
a first insulating layer on the second wiring layer;
a third wiring layer on the first insulating layer;
first microvias inside the first insulating layer and making electrical connections between the second wiring layer and the third wiring layer; and
second microvias electrically connecting at least some of the contact pads of the semiconductor chip to the third wiring layer.

16. The semiconductor chip package of claim 15 comprising:
a second insulating layer on the first wiring layer;
a fourth wiring layer on the second insulating layer; and
third microvias inside the second insulating layer and making electrical connections between the first wiring layer and the fourth wiring layer.

17. The electronic module of claim 15, wherein a plurality of electrical paths connect at least some of the contact pads of the semiconductor chip to the first wiring layer on the first surface of the dielectric substrate.

18. The electronic module of claim 17, wherein said plurality of electrical paths go through at least one second microvia, at least one conductor in the third wiring layer, at least one first microvia, at least one conductor in the second wiring layer and at least one feed through conductor.

* * * * *